United States Patent
Aoki et al.

[11] Patent Number: 6,121,579
[45] Date of Patent: Sep. 19, 2000

[54] HEATING APPARATUS, AND PROCESSING APPARATUS

[75] Inventors: Kazutsugu Aoki, Shiroyamamachi; Wataru Okase, Sagamihara; Hironori Yagi, Yokohama; Masamichi Nomura, Shiroyamamachi, all of Japan

[73] Assignee: Tokyo Electron Limited, Tokyo, Japan

[21] Appl. No.: 08/807,772

[22] Filed: Feb. 27, 1997

[30] Foreign Application Priority Data

| Feb. 28, 1996 | [JP] | Japan | 8-067261 |
| Sep. 21, 1996 | [JP] | Japan | 8-271497 |
| Nov. 13, 1996 | [JP] | Japan | 8-317150 |

[51] Int. Cl.[7] .................................................. F27B 11/00
[52] U.S. Cl. ........................ 219/390; 118/730; 219/444.1
[58] Field of Search .................................. 118/725, 730; 392/411, 415, 418, 416; 219/395, 411, 390, 405, 444.1

[56] References Cited

U.S. PATENT DOCUMENTS

| 4,469,529 | 9/1984 | Mimura | 392/414 |
| 5,108,792 | 4/1992 | Anderson et al. | 118/715 |
| 5,345,534 | 9/1994 | Najm et al. | 392/418 |
| 5,551,985 | 9/1996 | Brors et al. | 118/725 |
| 5,595,606 | 1/1997 | Fujikawa et al. | 118/725 |
| 5,624,499 | 4/1997 | Mizuno et al. | 118/725 |
| 5,650,082 | 7/1997 | Anderson | 118/725 |
| 5,683,518 | 11/1997 | Moore et al. | 392/418 |
| 5,708,755 | 1/1998 | Gronet et al. | 118/725 |
| 5,711,815 | 1/1998 | Lee et al. | 118/725 |
| 5,846,476 | 12/1998 | Hwang et al. | 264/493 |
| 5,889,258 | 3/1999 | Lubomirski et al. | 392/418 |
| 5,900,177 | 5/1999 | Lecouras et al. | 392/416 |
| 5,937,142 | 8/1999 | Moslehi et al. | 392/416 |
| 5,970,214 | 10/1999 | Gat | 392/416 |

FOREIGN PATENT DOCUMENTS 6-224135  8/1994  Japan .

OTHER PUBLICATIONS

Krishna C. Saraswat, et al., "Rapid Thermal Multiprocessing for a Programmable Factory for Adaptable Manufacturing of IC's", IEEE Transactions on Semiconductor Manufacturing, vol. 7, No. 2, May 1994, pp. 159–175.

*Primary Examiner*—Shrive Beck
*Assistant Examiner*—Sylvia R. MacArthur
*Attorney, Agent, or Firm*—Oblon, Spivak, McClelland, Maier & Neustadt, P.C.

[57] ABSTRACT

A heat treating apparatus comprises a process chamber within which a wafer is subjected to a heat treatment. A supporting plate for supporting the wafer is arranged within the process chamber. A process gas is supplied from above into the process chamber. A main heating means for heating the wafer is arranged below the process chamber, with a transmitting window interposed therebetween. The main heating means includes a plurality of heating sources for irradiating the supporting plate with heat rays so as to heat the wafer indirectly and a rotatable table having the heating sources arranged on the front surface thereof. The heat treating apparatus also comprises an auxiliary heating means for compensating for an uneven temperature caused on the surface of the wafer by the main heating means. The heating source of the auxiliary heating means is arranged on the surface of the rotatable table together with the heating sources of the main heating means, and the heat output from the heating source of the auxiliary heating means can be controlled independently of the heat output from the heating sources of the main heating means.

37 Claims, 13 Drawing Sheets

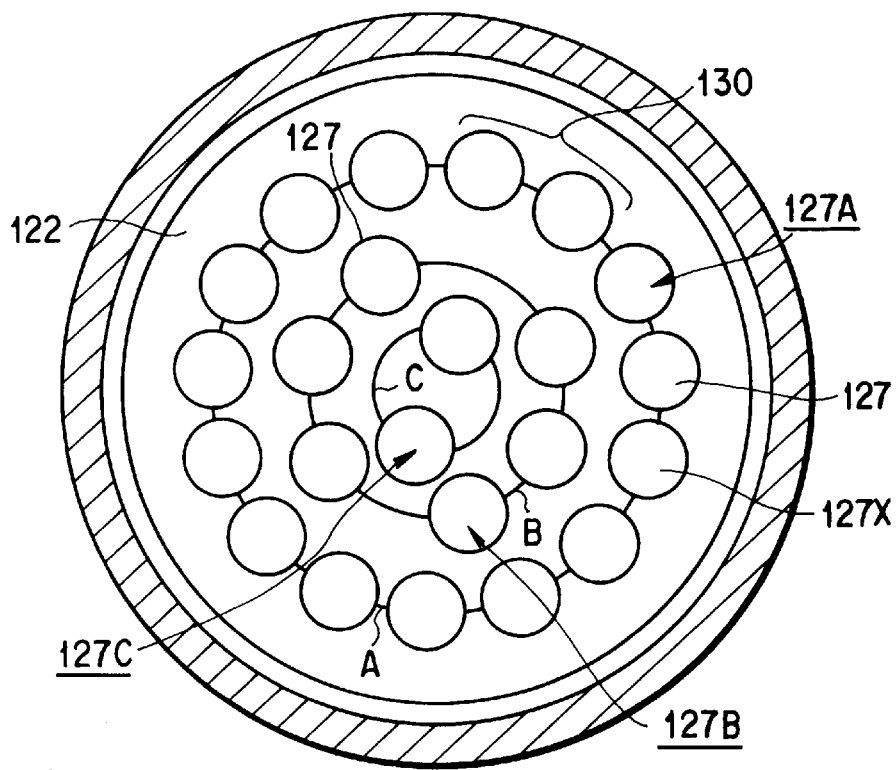
F I G. 4
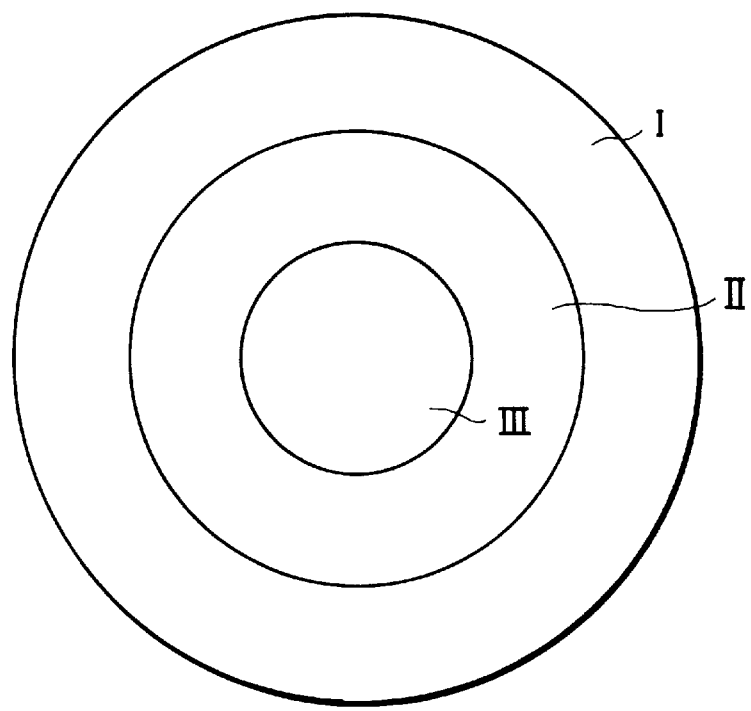
F I G. 5

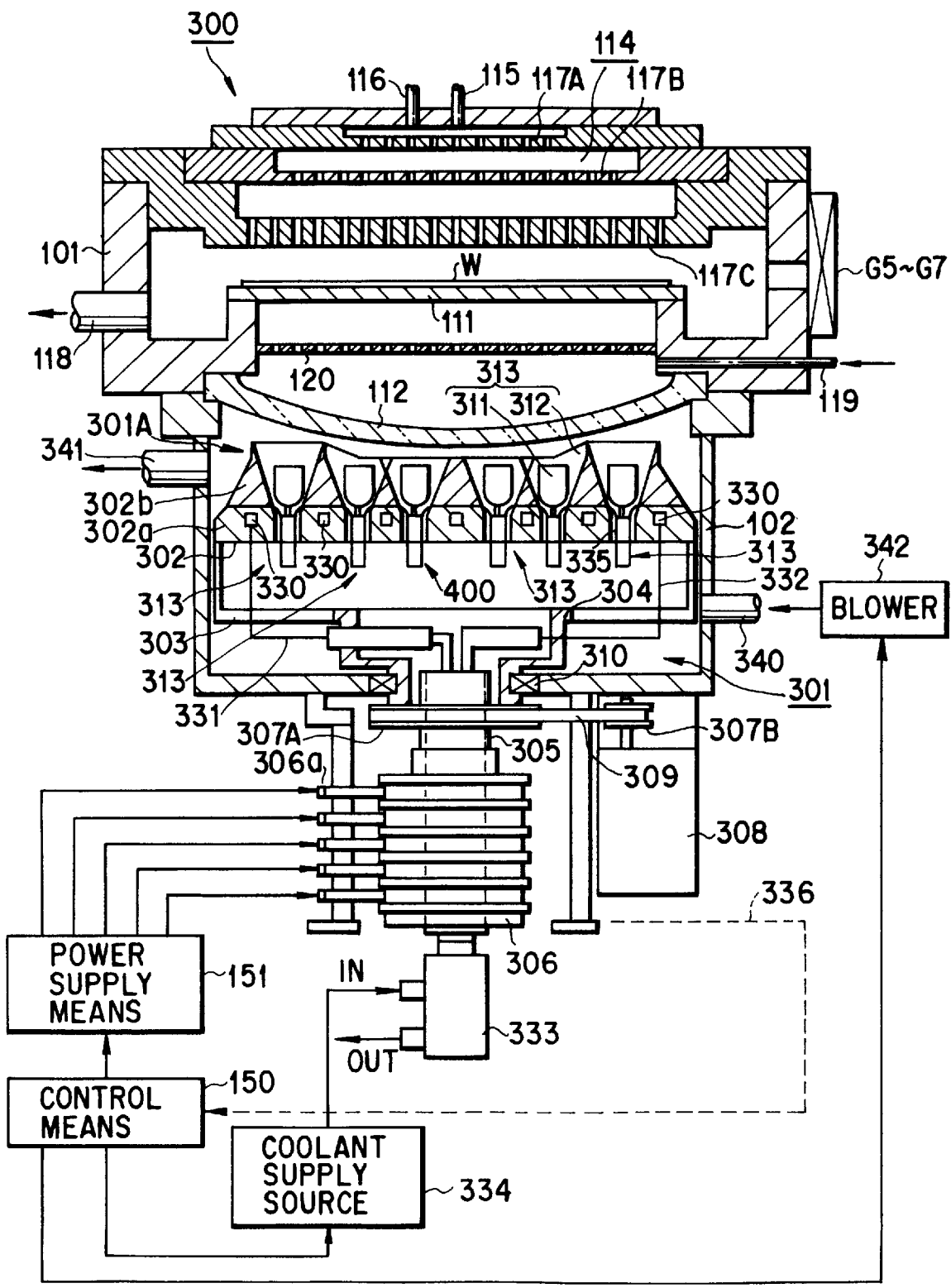
F I G. 7

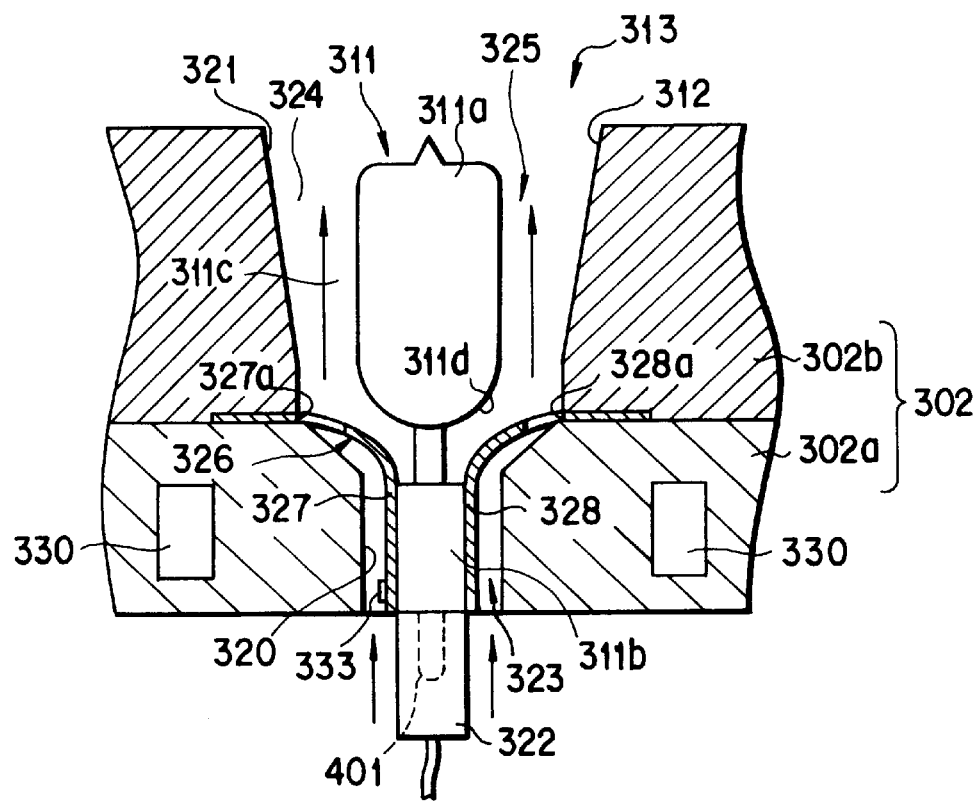
F I G. 8
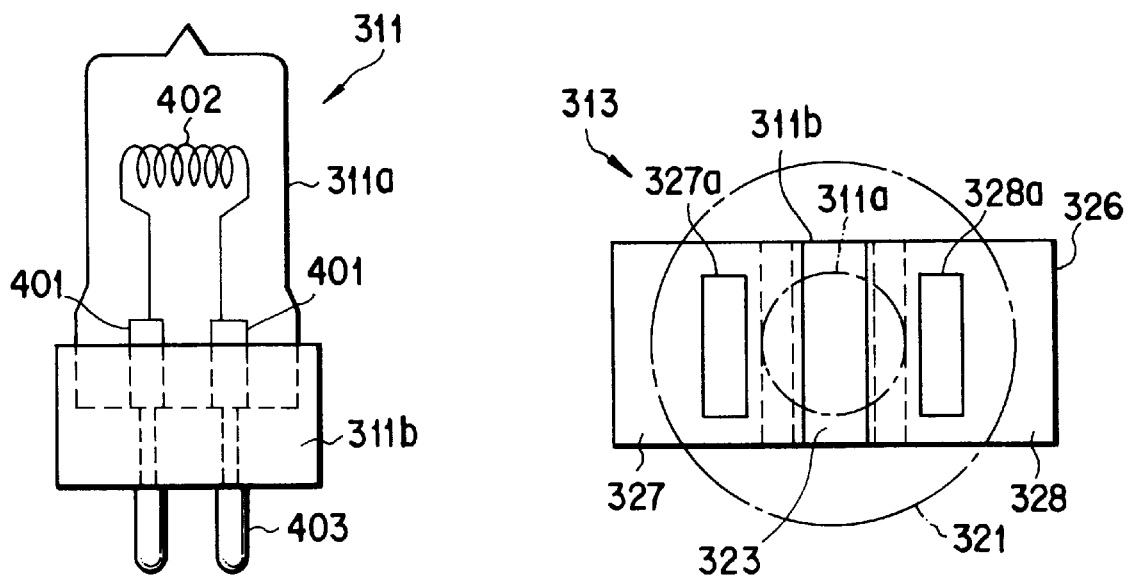
F I G. 9
F I G. 10

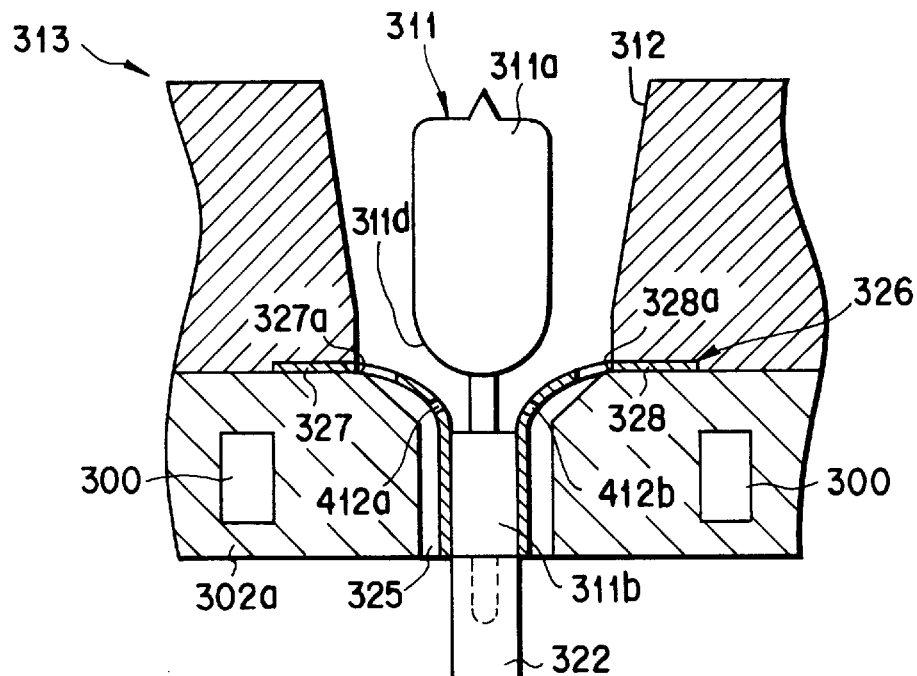
F I G. 13
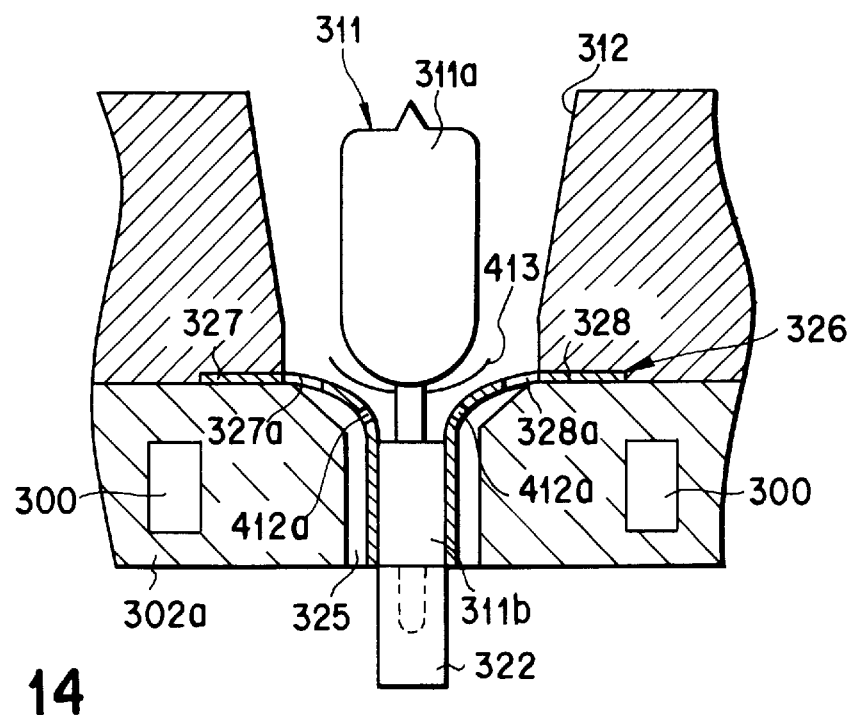
F I G. 14

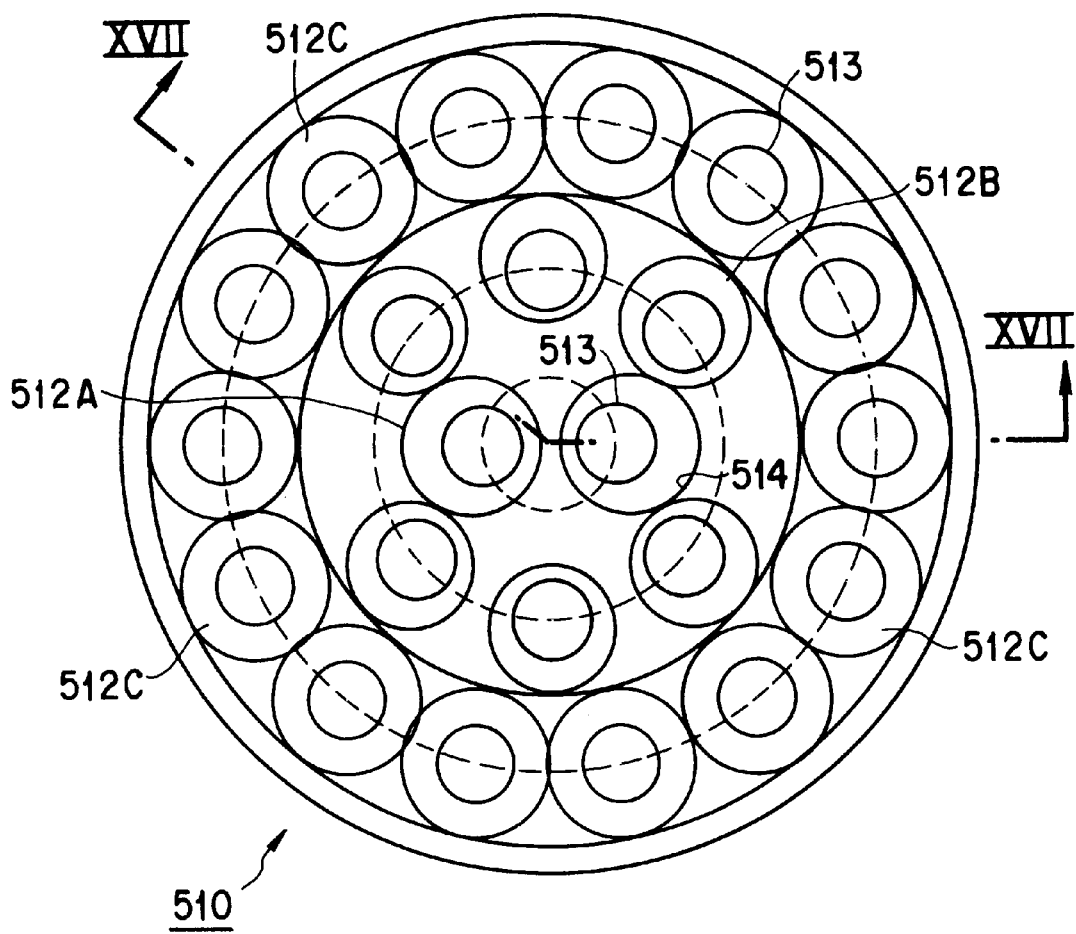
F I G. 16

HEATING APPARATUS, AND PROCESSING APPARATUS

BACKGROUND OF THE INVENTION

1. Field of the Invention

The present invention relates to a heating apparatus, as well as to a processing apparatus employed in the manufacture of a semiconductor device.

2. Discussion of the Background

The manufacturing process of a semiconductor device comprises in general the step of forming a thin film on an object to be processed, e.g., a semiconductor wafer, by using a CVD apparatus or a sputtering apparatus in order to form an integrated circuit on the semiconductor wafer. It should be noted that a nonuniform thickness of the thin film, which is caused in the film-forming step, leads to a low yield of the product integrated circuit element. The nonuniform thickness of the film is derived from a nonuniform temperature distribution over the semiconductor wafer surface in the step of heating the wafer, i.e., the object to be processed. Naturally, it is very important to keep the temperature uniform over the entire surface region of the wafer in the film-forming step.

In the conventional heat treating apparatus of a lamp heating type, in which the object to be processed is heated with energy rays, an object to be processed, e.g., semiconductor wafer W, is disposed on or within a process chamber. A processing gas is supplied by a gas supply means through a processing gas supply and a porous plate onto the surface of the wafer W within the process chamber. Also, the inner space of the process chamber communicates with an exhaust means via an exhaust port so as to keep the inner space of the process chamber at a predetermined degree of vacuum.

A heating chamber having a heating means disposed therein is arranged below the process chamber. The heating means, which consists of a heating lamp and a reflecting mirror, is arranged on a rotatable table.

A transmitting window is formed in a bottom portion of the process chamber. The light generated from the heating means is transmitted through the transmitting window so as to irradiate the wafer W with the light.

The heating means is divided into a plurality of different sets of the heating means. In accordance with rotation of the rotatable table supporting the heating means, these different sets of the heating means are allowed to form different annular heating regions 11, 12, 13 in the wafer W, as shown in FIG. 1. The heat energy supplied to these annular heating regions 11, 12, 13 can be controlled independently.

A cooling air is introduced through a cooling air supply port into the heating chamber by a cooling air supply means so as to cool appropriately the heating chamber, transmitting window and heating means.

In the lamp heating type heat treating apparatus of the construction described above, it is certainly possible to improve the uniformity of the temperature distribution in a radial direction over the entire surface of the wafer W by independently controlling the heat energy supplied to the annular heating regions of the wafer W. However, the conditions for the heat absorption and heat emission achieved by the wafer W are affected by the contact between the table and the semiconductor wafer W, the cooling air introduced into the heating chamber, and by asymmetry in the shape and material of the process chamber, resulting in failure for these conditions to be rendered uniform over the surface of the wafer W. It follows that the temperature distribution tends to be rendered nonuniform in the circumferential direction of the wafer W, making it difficult to keep the temperature of the wafer W uniform over the entire surface of the wafer W during the heat treatment.

It should also be noted that the conventional lamp heating type heating apparatus is constructed such that a cooling air is blown against all the heating lamps arranged within the heating chamber. In this construction, it is difficult to cool uniformly all the heating lamps.

In general, a halogen lamp is used as the heating lamp. In the halogen lamp, a halogen cycle is repeated, in which a filament component such as tungsten is evaporated to form a halogen compound and then, the halogen compound is decomposed such that the evaporated filament component is brought back to the filament. What should be noted, however, is that, if the temperature distribution is rendered nonuniform over the surface of the lamp body, i.e., bulb, the halogen compound is deposited on the low temperature region on the bulb surface, making it difficult to permit the halogen cycle to continue smoothly. As a result, the filament tends to be broken easily, leading to having low durability the heating lamp and, thus, to a short life of the lamp.

It should also be noted that the heating lamp is sealed in general by allowing a quartz glass of the lamp body to be bonded to an electrically conductive member such as a molybdenum foil. Therefore, if the sealing portion is heated excessively, a clearance is generated between the conductive member and the quartz glass because of the difference in the thermal expansion coefficient between the two. Naturally, the halogen gas is likely to leak to the outside through the clearance, leading to a low durability of the heating lamp.

In order to obtain a semiconductor device exhibiting satisfactory electrical characteristics, it is important to form a satisfactory film. Particularly, it is important to form a film of a uniform thickness on the wafer surface. It should be noted in this connection that the film-forming rate is markedly affected by only a small temperature difference. In other words, the wafer temperature must be kept uniform over the entire wafer region in order to form a film of a uniform thickness on the substrate surface.

The apparatus exemplified above is a so-called cold wall type processing apparatus in which the side wall of the process chamber is kept at substantially room temperature. Therefore, heat is released at, particularly, the peripheral portion of the table in a considerably large amount. In addition, the processing vessel is required to be miniaturized as much as possible. Naturally, the space for housing the heating lamps is very limited, making it necessary to increase the density of the lamp arrangement as much as possible. Under the circumstances, vigorous studies are being made as to how to arrange the heating lamps and how to perform the heating treatment in an attempt to ensure high uniformity of the temperature over the entire surface of the wafer. However, a satisfactory measure for achieving the object has not yet been reached. It should be noted in particular that the wafer size of 6 inches, which was popular in the past, is now being changed to 8 inches and, further, to 12 inches. If the design idea adapted for the semiconductor device involving a wafer size of 6 inches is applied as it is to the device involving a wafer size of 6 inches or 12 inches, a subtle temperature imbalance is brought about, leading to unsatisfactory results.

BRIEF SUMMARY OF THE INVENTION

A first object of the present invention is to provide a heating apparatus and a heat treating apparatus, which compensates for an uneven temperature distribution over the entire surface of an object to be treated so as to improve the uniformity of the treatment over the entire surface of the object.

A second object is to provide a heat treating apparatus which prolongs the life of the heating lamp so as to enable the apparatus to be excellent in its maintenance properties.

Further, a third object of the present invention is to provide a heat treating apparatus which compensates for the heat radiation from the outer circumferential region of the object so as to improve the uniformity of the temperature distribution over the entire region of the object.

According to a first aspect of the present invention, there is provided a heating apparatus for manufacturing a semiconductor device, comprising:

main heating means for heating an object to be processed, the main heating means including a plurality of heating sources for irradiating the object directly or indirectly with heat rays;

support means for supporting the object in the heating position of the main heating means;

rotating means for rotating the main heating means and the support means relative to each other; and auxiliary heating means for compensating for an uneven temperature distribution caused in the object by the heating of the main heating means, the auxiliary heating means comprising at least one heating source which can be controlled independently of the main heating means and which permits irradiating the object directly or indirectly with heat rays.

According to a second aspect of the present invention, there is provided a heat treating apparatus for manufacturing a semiconductor device, comprising:

a process chamber;

support means for supporting an object arranged within the process chamber;

process gas supply means for supplying a process gas into the process chamber;

main heating means for heating the object, the main heating means including a plurality of heating sources for irradiating the object directly or indirectly with heat rays;

rotating means for rotating the main heating means and the support means relative to each other; and auxiliary heating means for compensating for an uneven temperature distribution caused in the object by the heating of the main heating means, the auxiliary heating means comprising at least one heating source which can be controlled independently of the main heating means and which permits irradiating the object directly or indirectly with heat rays.

According to a third aspect of the present invention, there is provided a heat treating apparatus for manufacturing a semiconductor device, comprising:

a process chamber;

support means for supporting an object arranged within the process chamber;

process gas supply means for supplying a process gas into the process chamber;

a transmitting window formed within the process chamber;

heating means for heating the object, the heating means including a plurality of heating sources for irradiating via the transmitting window the object directly or indirectly with heat rays and a table having the heating sources arranged on the front surface thereof, each of the heating sources consisting of a heating lamp and a reflecting portion;

rotating means for rotating the heating means and the support means relative to each other;

a blown gas passageway extending from the front surface to the back surface of the table and included in each of the heating sources having the heating lamps arranged therein;

cooling gas supply/discharge means for allowing a cooling gas to flow through the blown gas passageway; and a gas flow regulator arranged within the blown gas passageway for preventing the cooling gas from being blown directly and locally against a part of a lamp body of the heating lamp.

Further, according to a fourth aspect of the present invention, there is provided a heat treating apparatus for manufacturing a semiconductor device, comprising:

a process chamber;

support means for supporting a substantially disk-like object arranged within the process chamber;

process gas supply means for supplying a process gas into the process chamber;

a transmitting window formed within the process chamber;

heating means for heating the object, the heating means including a plurality of heating sources for irradiating via the transmitting window the object directly or indirectly with heat rays and a table having the heating sources arranged on the front surface thereof, each of the heating sources consisting of a heating lamp and a reflecting portion; and rotating means for rotating the heating means and the support means relative to each other;

wherein the heating means are arranged to permit a peak of a curve of heat rays striking the object to be positioned somewhat outside of the outer periphery of the object supported by the support means, the curve denoting heat ray irradiation amount and radially extending from the center of the object to exceed the outer periphery.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a horizontal sectional view of a heating chamber of the heat treatment apparatus shown in the FIG. 3.

FIG. 5 is a top schematic illustration of annular heating regions formed on the wafer w.

FIG. 7 is a vertical sectional view of a heat treatment apparatus of the second embodiment of the present invention.

FIG. 8 is a vertical sectional view of a heating source of the heating apparatus shown in the FIG. 7.

FIG. 9 is a side view of a heating lamp of the heating source shown in the FIG. 8.

FIG. 10 is a plan view of the heating source shown in the FIG. 8.

FIG. 13 is a vertical sectional view of a second modification of the heating source of the second embodiment of the present invention.

FIG. 14 is a vertical sectional view of a third modification of the heating source of the second embodiment of the present invention.

FIG. 16 is a schematic plan view of a heating means of the heat treatment apparatus shown in the FIG. 15.

DETAILED DESCRIPTION OF THE INVENTION

Figure 1:
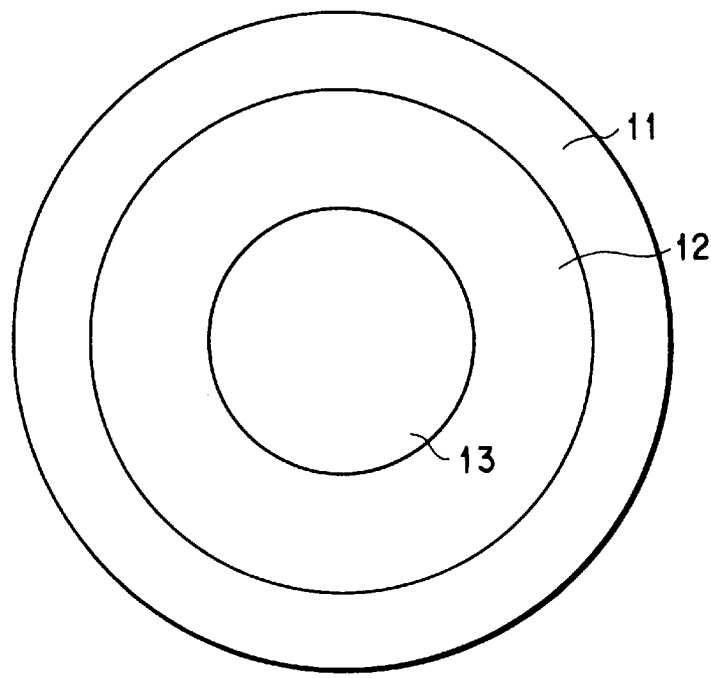
FIG. 1 is a schematic illustration of annular heating regions formed in the wafer by being irradiated with light from heating means in the conventional heat treatment apparatus of a lamp heating type.

The following is a detailed description of embodiments of the present invention with reference to the accompanying drawings. First of all, FIGS. 2 to 6 collectively show a one-by-one feeding type CVD apparatus utilizing the lamp heating device according to one embodiment of the present invention. The same members of the apparatus are denoted by the same reference numerals throughout these drawings.

Figure 2:
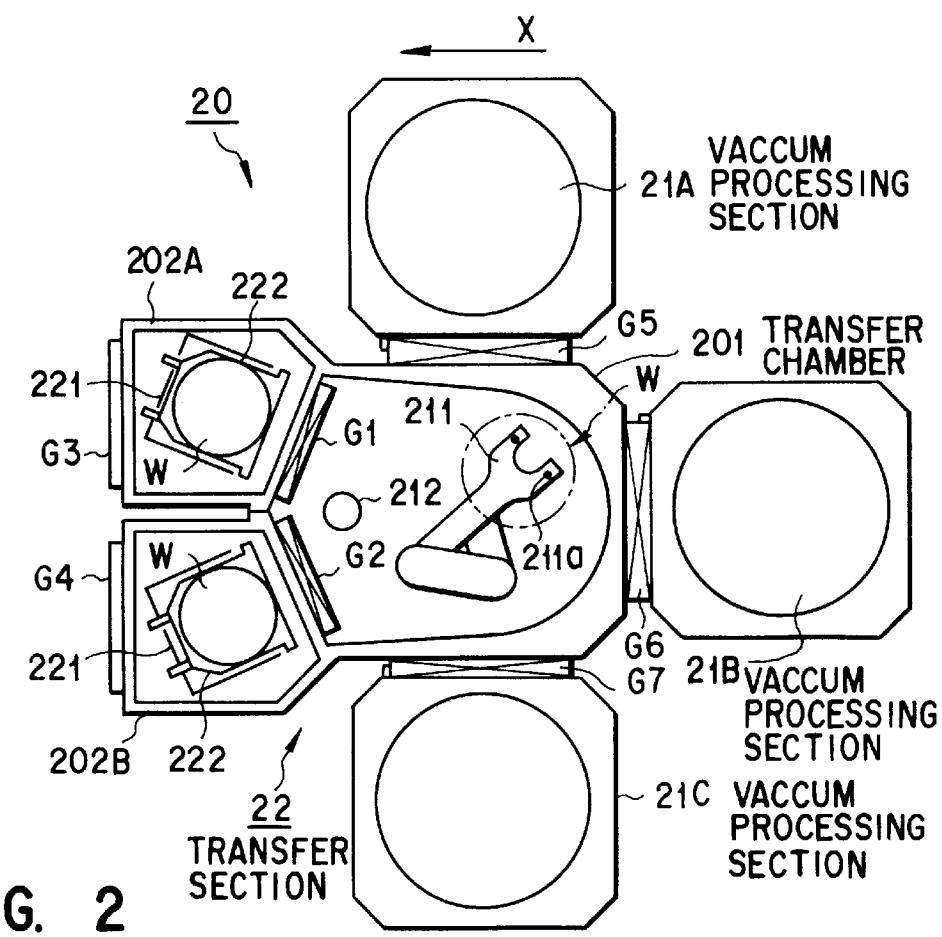
FIG. 2 is a diagrammatic tip plane view of a one-by one feeding type CVD apparatus of the first embodiment of the present invention.

As shown in FIG. 2, a CVD apparatus 20 comprises vacuum processing sections 21A, 21B, 21C and a transfer section 22. An arrow X in the drawing extends from a forward region toward a rearward region of the CVD apparatus 20. A CVD treatment is applied to an object to be processed, e.g., a wafer W, in each of the vacuum processing sections 21A, 21B, 21C. The wafer W is transferred between each of the vacuum processing sections 21A, 21B, 21C, and a cassette chamber, which will be described herein later, in the transfer section 22.

The transfer section 22 comprises a load lock type transfer chamber 201. A transfer means 211 consisting of a multi-joint arm and a rotatable stage 212 disposed rearward of the transfer means 211 are arranged within the transfer chamber 201. Suction holes 211a, which are connected to an exhaust means (not shown) via a sucking device (not shown), are formed in both edges in a tip portion of the arm constituting the transfer means 211. The transfer means 211, which holds a semiconductor wafer W at the tip portion of the arm by means of vacuum suction, permits transfer of the wafer W between cassette chambers, i.e., first and second cassette chambers 202A, 202B, and vacuum processing sections 21A, 21B. Furthermore, the rotatable stage 212 constitutes a position aligning means together with a light emitting-receiving section (not shown). The position-aligning means is constructed such that the wafer W is rotated by the rotatable stage 212 so as to detect the center position of the wafer W and the direction of the orientation flat of the wafer W.

The first cassette chamber 202A and the second cassette chamber 202B are arranged side by side rearward of the transfer chamber 201. A gate valve G1 is interposed between the first cassette chamber 202A and the transfer chamber 201. Likewise, a gate valve G2 is interposed between the second cassette chamber 202B and the transfer chamber 201. Each of the first and second cassette chambers 202A and 202B is equipped with a cassette stage 221 which is movable in a vertical direction. A wafer cassette 222 having a take-out port of the wafer W formed in a predetermined direction is disposed on the cassette stage 221. The wafer W before the treatment is housed in the wafer cassette 222 arranged within the first cassette chamber 202A. On the other hand, the wafer W, after the treatment is housed in the wafer cassette 222, is arranged within the second cassette chamber 202B.

The vacuum processing sections 21A and 21C are arranged sideward of the transfer chamber 201, with the vacuum processing section 21B being arranged forward of the transfer chamber 201. A gate valve G5 is interposed between the vacuum processing section 21A and the transfer chamber 201. Another gate valve G6 is interposed between the vacuum processing section 21B and the transfer chamber 201. Furthermore, a gate valve G7 is interposed between the vacuum processing section 21C and the transfer chamber 201.

Figure 3:
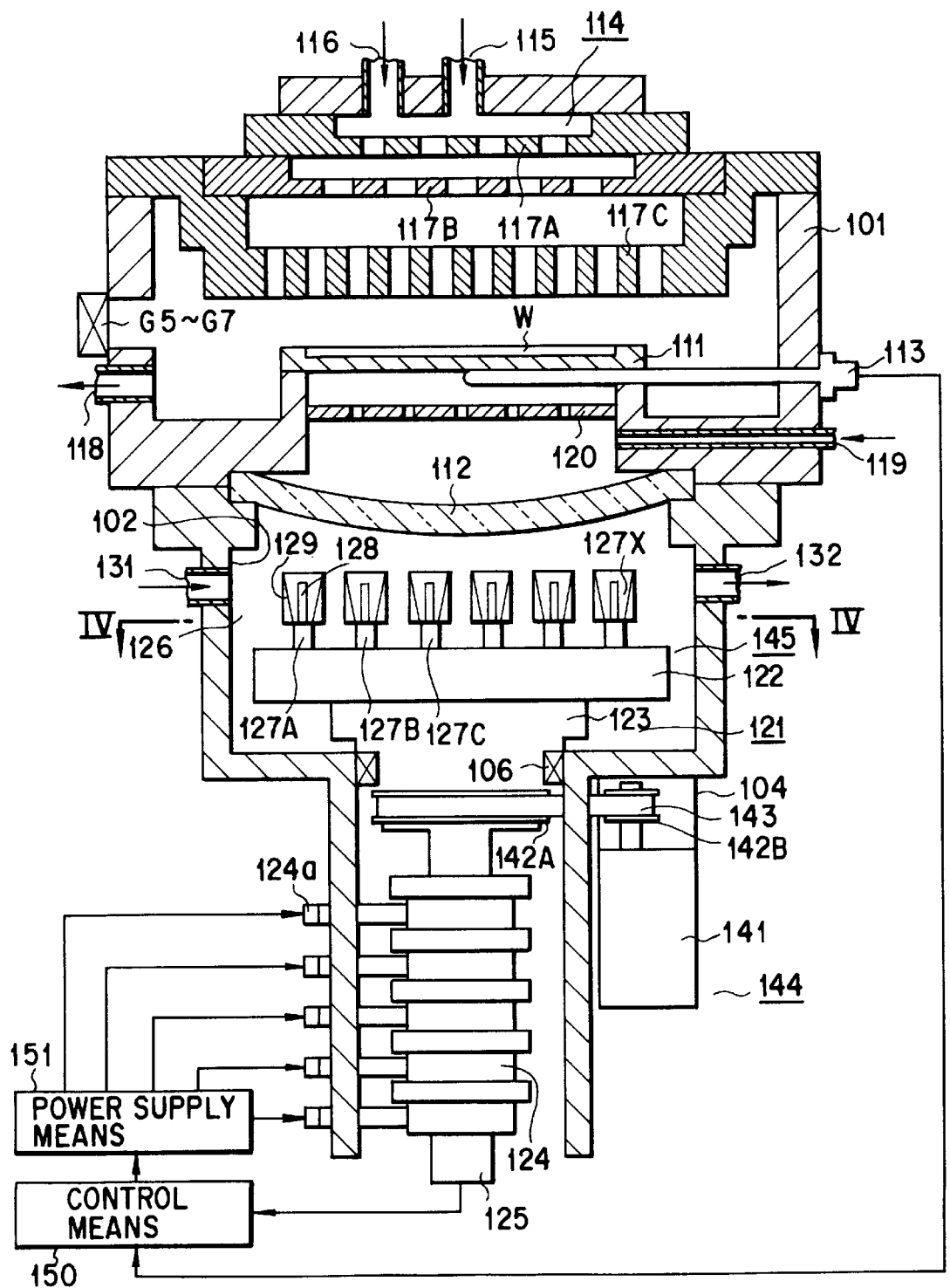
FIG. 3 is a vertical sectional view of the heat treatment apparatus of the CVD apparatus shown in the FIG. 2.

The vacuum processing sections 21A, 21B and 21C comprises a lump heating type-heat treatment apparatus shown in FIG. 3. Specifically, the heat treatment apparatus 100 comprises a process chamber 101, which is a cylindrical chamber made of, for example, aluminum. A holding means, e.g., a disc-like susceptor 111, is arranged within the chamber 101. A groove adapted for housing the wafer W is formed on the upper surface of the susceptor 111 which is heated by a heating means to be described herein later. The groove is formed into a shape being able to receive the objects, e.g., disk like shape. The heat of the heated susceptor 111 is transmitted to the wafer W supported thereon so as to heat the wafer W.

A transmitting window 112, which is made of a material capable of transmitting energy rays such as a quartz glass, is formed in a bottom portion of the process chamber 101. Energy rays emitted from a heating means 126, which is described later, are transmitted through the transmitting window 112, so as to strike the susceptor 111. The contact region between the transmitting window 112 and the lower wall of the process chamber 101 is sealed by a sealing means such as O-rings.

A temperature sensor, e.g., a thermocouple 113, is arranged to extend through the side wall of the process chamber 101 toward the center of the chamber 101. The temperature of the susceptor 111 can be measured by the thermocouple 113. An output signal of the thermocouple 113 is transmitted to a control means 150 consisting of, for example, an electronic computer.

A gas supply section 114, which includes a process gas supply port 115, a cleaning gas supply port 116, and three perforated plates 117A, 117B, 117C, is formed in a top portion of the chamber 101. A process gas or a cleaning gas is supplied through the process gas supply port 115 or cleaning gas supply port 116 into the gas supply section 114 by a gas supply means (not shown). The process gas or cleaning gas flows successively through the perforated plates 117A, 117B, 117C so as to be supplied uniformly in the form of a shower onto the treating surface of the wafer W.

An exhaust port 118 is formed through a side wall of the process chamber 101. The gas within the chamber 101 can be exhausted through the exhaust port 118 by an exhaust means (not shown).

An inert gas supply port 119 is formed through a side wall of the process chamber 101. An inert gas such as a nitrogen gas is introduced by an inert gas supply means (not shown) through the inert gas supply port 119 to fill a free space defined between the susceptor 111 and the transmitting window 112.

A buffer plate 120 is arranged within the free space defined between the susceptor 111 and the transmitting window 112. Gas holes are formed through the buffer plate 120 to form, for example, a lattice configuration or a concentric configuration so as to achieve a uniform gas flow rate over the entire surface of the wafer W. To be more specific, the buffer plate 120 provided with the gas holes arranged to form the particular configuration permits the inert gas introduced through the inert gas supply port 119 to be supplied uniformly into a region in the vicinity of the lower surface of the susceptor 111.

A heating chamber 10 having a rotating section 121 arranged therein is formed below the transmitting window 112. The rotating section 121 includes a rotatable table 122, a shaft 123, and a slip ring 124. A first pulley 142A is mounted to the shaft 123. As described herein later, the first pulley 142A constitutes a driving means of the rotating section 121 together with a driving source, a second pulley and a belt. The slip ring 124 is arranged to allow a power supply means 151 to supply power to the heating source 127 via a power supply terminal 124a. A position sensor, e.g., an encoder 125, is arranged in a lower portion of the slip ring 124. The encoder 125 permits detecting the rotating position of the rotating table 122. The output from the encoder 125 is supplied to the control means 150. The rotating section 121 can be rotated by a driving means, which will be described herein later, relative to the heating chamber 102. Furthermore, a bearing 106 is arranged in the contact portion between the shaft 123 and the inner wall of the heating chamber 102. The bearing 106 permits the rotating section 121 to be rotated smoothly relative to the heating chamber 102.

A heating means 126 consisting of a plurality of heating sources 127 is mounted to a predetermined position of the rotatable table 122. The heating source 127 includes a heating lamp 128, e.g., a halogen lamp, and a reflecting mirror 129. As is apparent from FIG. 3, the heating means 126 is arranged to permit the heat energy generated from the plural heating sources 127 to be emitted in a predetermined direction through the transmitting window 112.

As shown in FIG. 4, the heating sources 127 are arranged to form a plurality of concentric circles, e.g., concentric circles A, B, C, on the rotatable table 122. These heating sources 127 are divided into a first heating source group 127A, a second heating source group 127B and a third heating source group 127C. As is apparent from FIG. 4, these concentric circles A, B, C meet the relationship A>B>C in terms of the radius. The first heating source group 127A consists of 15 heating sources 127 which are arrange on the concentric circle A. The second heating source group 127B consists of 6 heating sources 127 which are arranged on the concentric circle B. Furthermore, the third heating source group 127C consists of 2 heating sources 127 which are arranged on the concentric circle C. If the rotatable table 122 is rotated, these heating source groups 127A, 127B and 127C form separate annular heating zones in the wafer W, as described latter.

The heating sources 127 included in each of the heating source groups 127A, 127B, 127C are divided into a plurality of pairs, each pair consisting of two heating sources 127 to form a paired heating source 130. These heating sources 127 are arranged to permit each of the paired heating sources 130 to be controlled independently. In the first heating source group 127A, 7 paired heating sources 130 are formed by the 14 heating sources 127. In this case, the remaining one heating source 127 is used as an auxiliary heating source 127X.

As shown in FIG. 3, a cooling air inlet port 131 and a cooling air outlet port 132 are formed opposite to each other through the side wall of the heating chamber 102. A cooling gas of the heating source, e.g., a nitrogen gas, is introduced through the cooling air inlet port 131 into the heating chamber 102 by a cooling air supply means (not shown) so as to cool the heating sources 127. Then, the cooling gas is discharged to the outside through the cooling air outlet port 132.

A driving chamber 104 is mounted in contact with the heating chamber 102. A driving source, e.g., a variable speed AC motor 141, is arranged within the driving chamber 104. The rotating section 121 can be rotated by the variable speed AC motor 141. A second pulley 142B is mounted to the rotatable shaft of the variable speed AC motor 141. Furthermore, a belt 143 is stretched to cause the first and second pulleys 142A and 142B to be moved together. It should be noted that the variable speed AC motor 141, the first and second pulleys 142A, 142B, and the belt 143 collectively form a driving means 144 for driving the rotating section 121. Furthermore, the driving means 144 and the rotating section 121 collectively constitute a rotating means 145 for rotating the heating means 126.

With reference to FIG. 2, the one-by-one feeding type CVD apparatus 20 utilizing the lamp heating, which is constructed as described above, is operated as follows. It should be noted that the operation which is to be described is automatically carried out in accordance with a program stored in advance.

In the first step, the gate valve G1 is opened. Then, the wafer W within the cassette 222 is held by vacuum suction on the arm of the transfer means 211 so as to be transferred into the transfer chamber 201 filled in advance with an inert gas atmosphere of atmospheric pressure, followed by releasing the vacuum suction so as to release the wafer W onto the rotatable stage 212. After the wafer W is disposed on the rotatable stage 212, the gate valve G1 is closed. Under this condition, the rotatable stage 212 is rotated for performing an orientation flat alignment and a central position alignment. Then, the wafer W is held again by vacuum suction on the arm of the transfer means 211, followed by exhausting the transfer chamber 201 to a predetermined degree of vacuum by operating an exhausting means (not shown).

In the next step, the gate valve G5 is opened, followed by operating the transfer means 211 to transfer the wafer W into the process chamber 101 included in the heat treatment apparatus 100 of the vacuum processing section 21A and evacuated in advance by an exhaust means (not shown) to a predetermined degree of vacuum. The wafer W is disposed in the wafer-holding groove of the susceptor 111 arranged within the process chamber 101. Then, the gate valve G5 is closed, followed by the step of driving the driving means 144 shown in FIG. 3 to rotate the rotating section 121 at a speed adapted for preventing the wafer W from being heated nonuniformly, e.g., at 5 to 10 rpm. Also, a predetermined value of electric power is supplied from the power supply means 151 to the heating sources 127 through the power supply terminal 124a and the slip ring 124. For example, 0.5 to 1 kW of power is supplied to the auxiliary heating source 127X. On the other hand, 10 to 25 kW of power is supplied to the other heating sources 127. The energy generated from the heating means 126, which is kept rotated, is transmitted through the transmitting window 112 to the susceptor 111 so as to elevate the susceptor temperature. Further, the heat of the susceptor 111 is transmitted to the wafer W so as to heat the wafer W uniformly over the entire surface region up to the processing temperature, e.g., 500 to 700° C. The operation of the heating means 126 will be described herein later in detail.

Then, a gas supply means (not shown) is operated to supply a process gas through the process gas supply port 115 into the process chamber 101. The process gas flows through the three perforated plates 117A, 117B, 117C, with the result that the process gas is supplied in the form of a shower to a region in the vicinity of the treating surface of the wafer W. A film is formed on the treating surface of the wafer W by CVD using the process gas as a raw material. During the film-forming process, the pressure within the process chamber 101 is kept at a predetermined value, e.g., 5 to 20 Torr. Also, the temperature of the heating means 126 is fed back to the control means 150 based on the output data generated from the thermocouple 113 in order to maintain constant the treating temperature of the wafer W.

Concerning the lamp heating described previously, a cooling air, e.g., a nitrogen gas, is introduced through the cooling air inlet port 131 into the heating chamber 102 by operating a cooling air supply means (not shown). The heating means 126 and the transmitting window 112 are prevented from over-heating by the cooling air.

During the film-forming process described previously, an inert gas, e.g., a nitrogen gas, is supplied through the inert gas supply port 119 into a free space defined between the susceptor 111 and the transmitting window 112 by operating an inert gas supply means (not shown). The nitrogen gas flows through the gas holes of the buffer plate 120 so as to be supplied uniformly to a region near the lower surface of the susceptor 111. The nitrogen gas further flows through the clearances of the susceptor 111 into the processing space above the wafer W. It should be noted that the nitrogen gas serves to prevent the process gas from flowing through the clearances of the susceptor 111 into the space below the susceptor 111. As a result, the process gas is prevented from being supplied into a region near the upper surface of the transmitting window 112. It follows that a film is not formed on the transmitting window 112. It should also be noted that the buffer plate 120 permits the nitrogen gas to be supplied uniformly into a region near the lower surface of the susceptor 111, with the result that the effect of preventing the inflow of the process gas is produced uniformly over the entire clearance of the susceptor 111. In addition, since the heat transmission between the susceptor 111 and the nitrogen gas is performed uniformly, the nitrogen gas does not impair the uniformity of the temperature distribution over the entire treating surface of the wafer W.

After the film-forming operation is implemented for a predetermined period of time, supply of the process gas is stopped. The power supply to the heating means 126 is also stopped.

Then, the process gas remaining within the process chamber 101 is exhausted such that the pressure within the chamber 101 is made somewhat lower than the pressure within the transfer chamber 201. As a result, the remaining reaction product or process gas, which may be floating within the chamber 101, is prevented from flowing into the transfer chamber 201, making it possible to prevent the transfer chamber 201 from being contaminated. Then, the gate valve G5 is opened again, followed by operating the transfer means 211 to transfer the wafer W after the film-forming treatment into the transfer chamber 201 having the inner pressure reduced in advance to a predetermined degree of vacuum. After transfer of the wafer W into the transfer chamber 201, the gate valve G5 is closed again, followed by the step of introducing an inert gas into the transfer chamber 201 by operating the inert gas supply means (not shown) to fill the transfer chamber 201 with the inert gas of atmospheric pressure.

In the next step, the gate valve G2 is opened, followed by operating the transfer means 211 to transfer the wafer W into the second cassette chamber 202 having an inert gas of atmospheric pressure introduced thereinto in advance.

The heating means 126 included in the lamp-heating type CVD apparatus 20 is operated as follows. To reiterate, the heating means 126 comprises the heating source groups 127A, 127B and 127C. Also, the heating source group 127A includes the auxiliary heating source 127X.

The heating source groups 127A, 127B, 127C are operated as follows. Specifically, these heating source groups 127A, 127B, 127C heat the susceptor 111, then heating the wafer W indirectly, as a result of concentric annular heating, zones I, II, III are formed in the wafer W 111 as shown in FIG. 5. It should be noted that the heat outputs from the heating source groups 127A, 127B, and 127C can be controlled independently, making it possible to control the heating amounts of the wafer W heated by the annular heating zones I, II and III. The heat output ratio among the heating source groups 127A, 127B, 127C should be determined appropriately depending on the treating conditions based on an output ratio determined in advance by using a sample wafer. As a result, it is possible to improve the uniformity of temperature over the heating zones I, II, and III. In other words, the uniformity of the temperature distribution in the radial direction of the wafer W can be improved.

It should be noted, however, that the heating of the wafer W is affected by the contact of the wafer W with the susceptor 111, the cooling air introduced into the heating chamber 102, the asymmetry in the shape and material of the process chamber 101, etc. As a result, the heat absorption and release of heat achieved by the wafer W fail to be uniform within each of the heating zones I, II and III. In other words, a non-uniform temperature distribution tends to take place in the circumferential direction of the wafer W.

Figure 6A:
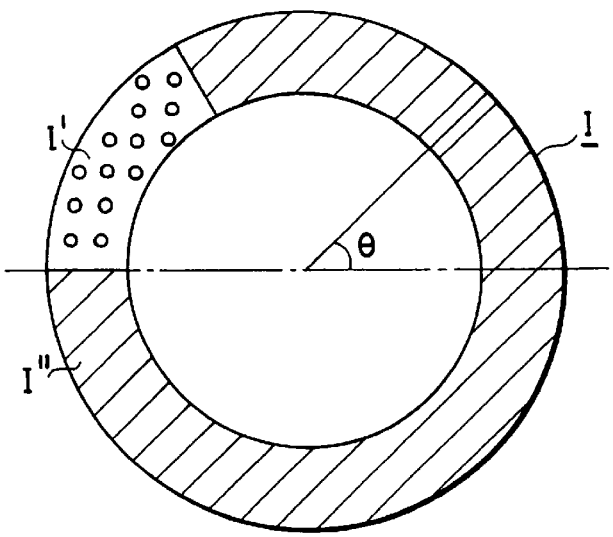
FIGS. 6A and 6B are schematic illustration of a heating region I containing a uniform temperature region I", and other region I' differing in temperature form the region I"
Figure 6B:
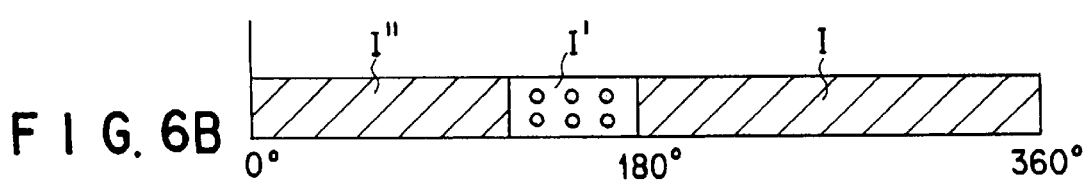
Figure 6C:
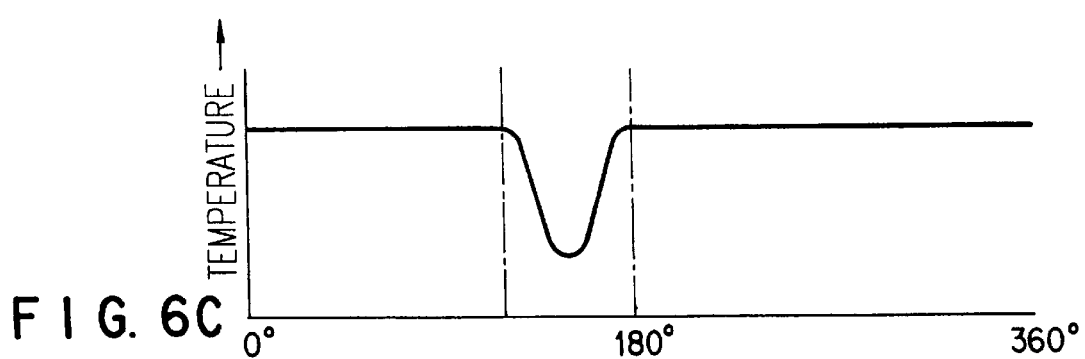
FIG. 6C is a graph showing a relationship between a temperature of the wafer W and a rotation angle of the wafer W.
Figure 6D:
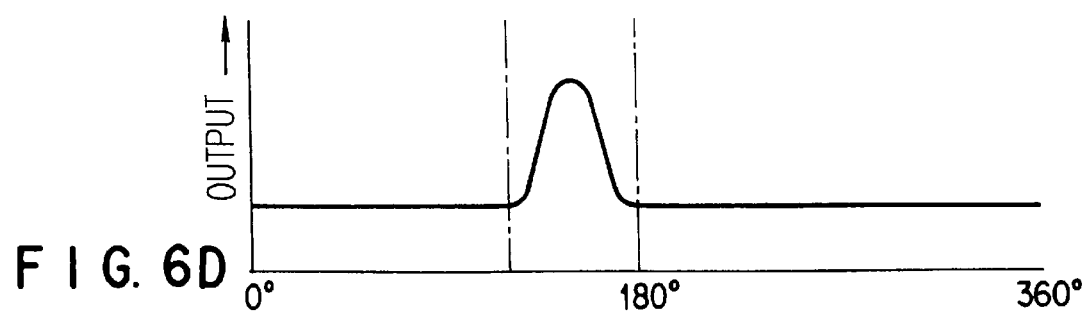
FIG. 6D is a graph showing a relationship between an output of the heating sources and the auxiliary heating wafer.

In the present invention, however, the heating sources 127 include the auxiliary heating source 127X to solve the subject described above. Suppose the heating zone I includes a uniform temperature region I" and a region I' differing in temperature from the region I", as shown in FIGS. 6A and 6B. In this case, the heat output of the auxiliary heating source 127X is controlled during its rotation to make up for the temperature difference between the regions I" and I' so as to improve the uniformity of the temperature distribution over the entire heating region I and, thus, to achieve a uniform heating of the wafer W. For example, where the temperature of the region I' is lower than that of the region I", as shown in FIG. 6C, the heat output of the auxiliary heating source 127X is controlled as shown in FIG. 6D. To be more specific, the heat output of the auxiliary heating source 127X is increased when the region I' with a lower temperature is heated by the auxiliary heating source 127X. On the other hand, where the temperature of the region I' is higher than that of the region I", the heat output of the auxiliary heating source 127X is decreased when the region I' is heated by the auxiliary heating source 127X.

The heat output of the auxiliary heating source 127X is controlled by the control means 150, as follows. Specifically, the orbital position of the auxiliary heating source 127X is detected by the output of the encoder 125. Then, the period during which the auxiliary heating source 127X is positioned within a region corresponding to the region I' during its orbital rotation is detected based on the detected orbital position of the auxiliary heating source 127X and the temperature region I' determined in advance by using a sample wafer. During the period noted above, the heat output of the auxiliary heating source 127X is controlled to make up for a difference in temperature between the regions I' and I". In controlling the heat output, the timing of transmitting a control signal generated from the control means 150 is shifted from the timing at which the auxiliary heating source 127X passes through the orbital region corresponding to the region I' in view of the delay of response of the lamp output. The shifting amount is determined on the basis of an optimum value, which is determined in advance by using a sample wafer, for achieving a uniform temperature distribution over the entire region of the wafer W. Furthermore, the control pattern of the heat output from the auxiliary heating source 127X is determined on the basis of an optimum pattern, which is determined in advance by using a sample wafer, for achieving a uniform temperature distribution over the entire region of the wafer W.

As described above, the CVD apparatus 20 according to the first embodiment of the present invention comprises the heating source groups 127A, 127B and 127C. In the first embodiment, the heat outputs of these heating source groups 127A, 127B, and 127C are controlled independently so as to adjust the heating amounts of the heating zones I, II, and III formed in the wafer W, with the result that the temperature distribution of the wafer W is made uniform in the radial direction of the wafer W. In addition, the heat output from the auxiliary heating source 127X is controlled appropriately so as to improve the uniformity of the temperature distribution in the circumferential direction of the wafer W. In other words, a temperature difference occurring in the circumferential direction of the wafer W can be compensated by the auxiliary heating source 127X. It follows that uniformity of the temperature distribution over the entire region of the wafer W can be improved in the present invention.

In the first embodiment described above, a single lamp is used as the auxiliary heating source. Needless to say, however, a plurality of lamps can be used together as the auxiliary heating source. Also, the heating means 126 included in the first embodiment comprises the auxiliary heating source 127X and other. heating sources 127 forming the heating source groups 127A, 127B, and 127C. However, it is possible that the auxiliary heating source is separated from the heating means and the heat means is constituted with a plurality of heating sources 127 only.

Further, in the first embodiment, a region on the wafer W differing in temperature from the other region is determined in advance by using a sample wafer. However, it is also possible to determine the particular region during the heat treatment by measuring the wafer temperature at many points using a plurality of temperature sensors, or by measuring the temperature distribution over the wafer surface using a thermoviewer.

It should also be noted that, in the first embodiment, the heating means 126 is rotated by the rotating means 145, with the wafer W, i.e., the object to be treated, fixed. Alternatively, the wafer W may be rotated by a rotating means, with the heating means fixed, or both the heating means and wafer W may be rotated relative to each other by a rotating means.

What should also be noted is that, in the first embodiment, a disk-like susceptor is used for supporting the entire surface region of the wafer W. Alternatively, it is also possible to use a supporting means for supporting the circumferential peripheral region alone of the wafer.

Let us describe a one-by-one feeding type CVD apparatus utilizing the lamp heating according to a second embodiment of the present invention. The CVD apparatus of the second embodiment comprises the transfer section 22 and the vacuum processing sections 21A, 21B, 21C, like the CVD apparatus 10 of the first embodiment shown in FIG. 2.

FIG. 7 schematically shows a lamp heating type heat treating apparatus 300 constituting each of the vacuum processing sections 21A, 21B and 21C. The constituting members of the apparatus 300 equal to those of the apparatus shown in FIG. 3 are denoted by the same reference numerals, and the descriptions thereof are omitted in the following description of the apparatus 300.

The heat treating apparatus 300 comprises the process chamber 101 like the apparatus shown in FIG. 3. The susceptor 111 is arranged inside the chamber 101, and the transmitting window 112 is formed in the bottom portion of the chamber 101. The gas supply portion 114, which includes the process gas supply port 115, the cleaning gas supply port 116, and three perforated plates 117A, 117B, 117C, is formed in a top portion of the chamber 101. The inert gas supply port 119 is formed through the side wall of the process chamber 101. Further, the buffer plate 120 is arranged in a region surrounded by the susceptor 111 and the transmitting window 112.

The heating means 102 having a rotatable section 301 formed therein is arranged below the process chamber 101, with the transmitting window 112 interposed therebetween. The rotatable section 301 comprises a rotatable table 302, a support arm 303, a rotor 304, a shaft 305 and a slip ring 306.

A first pulley 307A, which is mounted to the shaft 305, forms the driving means of the rotatable section 301 together with a driving source 308, a second pulley 307B and a belt 309.

The slip ring 306 is arranged to permit an electric power to be supplied from the power supply means 151 to a heating source 313 via a power supply terminal 306*a*.

A bearing 310 is arranged in the contact portion between the rotor 304 and the inner wall of the heating chamber 102, with the result that the rotatable section 301 can be rotated smoothly relative to the heating chamber 102.

A plurality of heating sources 313 each consisting of a heating lamp 311 and a cone-shaped reflecting portion 312 are arranged in predetermined positions of the rotatable table 302. FIG. 8 shows a vertical cross section of the heating source 313 included in the apparatus of the second embodiment. As shown in the drawing, the heating source 313 comprises the heating lamp 311, e.g., a halogen lamp, and the cone-shaped reflecting portion 312. As shown in FIG. 9, the heating lamp 311 includes a lamp body 311*a* made of a quartz glass, i.e., a bulb. A tungsten filament 402 having each end connected to a conductive member 401 formed of, for example, a molybdenum foil, which is arranged within the lamp body 311*a*. Furthermore a quartz glass (not shown) is hermetically bonded to the conductive member 401 so as to seal the lamp body 311*a*. A substantially cubic sealing portion 311*b* made of, for example, alumina ($Al_2O_3$) and including terminals 403 electrically connected to the conductive members 401 is mounted to the sealing portion of the lamp body 311*a*. Incidentally, FIG. 9 shows the heating lamp 311 as seen sideways, if FIG. 8 is assumed to be a front view of the lamp 311.

As shown in FIG. 8, the rotatable table 302 comprises a base 302*a* and a reflector 302*b* superposed on the upper surface of the base 302*a*. A plurality of insertion holes 320 into which the sealing portions 311*b* of the heating lamps 311 and inserted are formed in the base 302*a*. The number of these insertion holes 320 is equal to that of the heating lamps 311. The insertion hole 320 is substantially cylindrical, extends through the base 302*a*, and has an upwardly enlarged upper open region.

The reflector 302*b* has a plurality of through holes 321 housing the lamp body 311*a* and formed therein such that the inner surface, which acts as a reflecting plane 321*a* and defines each of the through holes 321, constitutes the cone-shaped reflecting portion 312. The number of these through holes 321 is equal to that of the insertion holes 320. Also, each through hole 321 communicates with each insertion hole 320. The reflecting plane 321*a* formed by the wall of the through hole 321 is inclined to permit the light generated from the heating lamp 311 to be collected on a predetermined position on the surface of the susceptor 111. The diameter of the through hole 321 at the lower open end is substantially equal to that at the upper open end of the insertion hole 320 formed in the base 302*a*.

The base 302*a* of the rotatable table 302 is formed of, for example, an aluminum alloy. On the other hand, the reflector 302*b* comprises, for example, a base body made of an aluminum alloy and a metal such as gold plated on the outer surface of the base body.

A single heating lamp 311*a* is mounted within a set of the insertion hole 320 and the through hole 321. To be more specific, the sealing portion 311*b* and terminals 403 of the heating lamp 311 are arranged within the insertion hole 320 such that the terminals 403 are inserted into a socket 322. Brackets (not shown) are mounted to both end portions in the longitudinal direction of the socket 322 so as to permit the socket 322 to be fixed to the lower surface of the base 302*a* by means of a screw engagement.

Where the heating lamp 311 is fixed to the rotatable table 302 as described above, a first annular space 323 is formed between the sealing portion 311*b* of the heating lamp 311 and the base 302*a* of the rotatable table 302. Also, a second annular space 324 communicating with the first annular space 323 is formed between the lamp body 311*a* of the heating lamp 311 and the reflector 302*b* of the rotatable table 302. These first and second annular spaces 323 and 324 collectively form an air passageway 325 extending from the lower open end of the insertion hole 320 to reach the upper open end of the through hole 321.

An air flow regulator 326 is arranged within the air passageway 325. As shown in FIG. 10, the air flow regulator 326 consists of substantially rectangular two leaf springs 327 and 328. As shown in FIG. 8, each of these leaf springs 327, 328 is bonded under pressure at one end portion to the side surface of the sealing portion 311*b* of the heating lamp 311. On the other hand, the other end portion of each of these leaf springs 327, 328 extends upward through the upper open end of the insertion hole 320 so as to be fixed in a manner to be sandwiched between the base 302*a* and the reflector 302*b* of the rotatable table 302. It follows that these leaf springs 327, 328 are bent, as shown in FIG. 8.

FIG. 10 shows that rectangular cooling gas passing holes 327*a*, 328*a* are formed in the leaf springs 327, 328, respectively, in a manner to extend along the longer sides of the sealing portion 311*b*. These cooling gas passing holes 327*a*, 328*a* are positioned between the outer circumferential surface of the lamp body 311*a* and the inner wall defining the through hole 321 formed in the reflector 302*b* and, thus, do not extend under a lower surface 311*d* of the lamp body 311*a*. Incidentally, the leaf springs 327, 328 are formed of, for example, phosphor bronze which exhibits an excellent heat conductivity.

Figure 11:
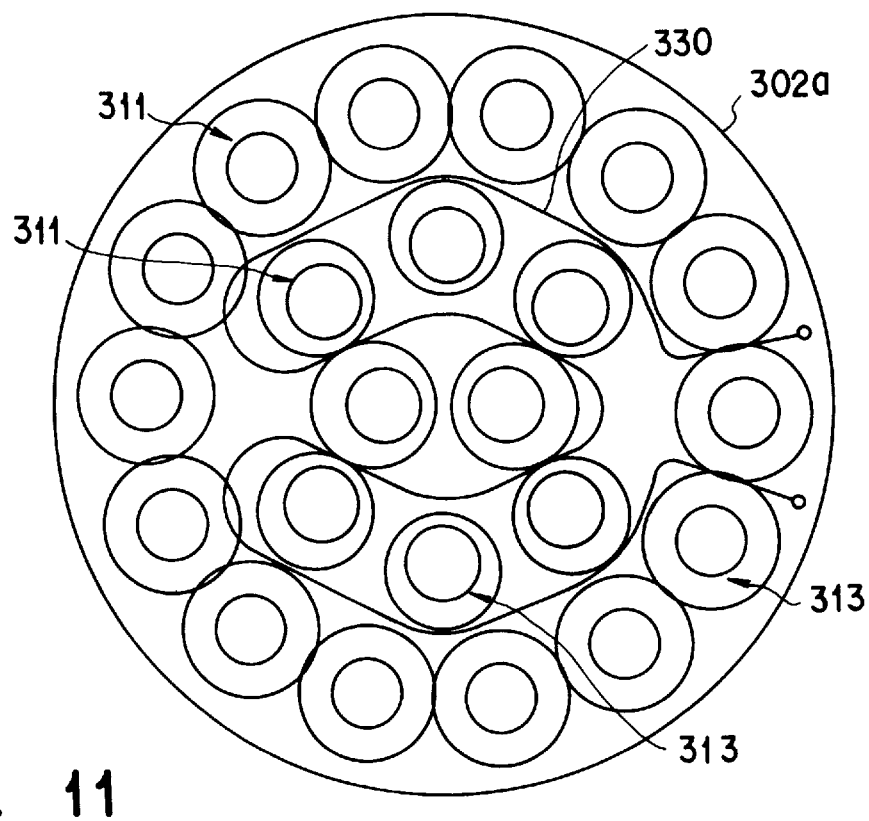
FIG. 11 is a schematic plane view of the heating means shown in the FIG. 7.

As shown in FIGS. 7 and 8, a coolant passageway 330 is formed in the base 302*a* of the rotatable table 302. It should be noted that a plurality of heating sources 313 are supported by the rotatable table 302. In the second embodiment shown in FIGS. 7 and 8, 22 heating sources are supported by the rotatable table 302. What should be noted is that the coolant passageway 330 is arranged to extend through a free region provided between adjacent heating sources 313, as shown in FIG. 11. As shown in FIG. 7, a coolant supply pipe 331 is connected at one end to one end of the coolant passageway 330 and is also connected at the other end to a coolant supply source 334 via the inner space of the hollow shaft 305 and a coolant supply/discharge header 333 which is connected to the lower end portion of the shaft 305. On the other hand, the other end of the coolant supply passageway 330 is connected to a coolant discharge pipe 332 and, then, to a discharge line (not shown) through the inner space of the hollow shaft 305. The particular construction described above permits a coolant such as water at room temperature to be circulated through the coolant passageway 330 formed within the base 302*a* of the rotatable table 302.

As shown in FIG. 7, a temperature sensor 335 consisting of, for example, a thermocouple is formed in at least one of the heating sources 313. To be more specific, the temperature sensor 335 is formed in that portion of one of the leaf springs 327, 328 which is bonded under pressure to the sealing portion 311*b* of the heating lamp 311, and is connected to the control means 150 through a signal transmission line 336. It should be noted that the control means 150 serves to control the coolant supply means 334 based on the measuring signal fed back from the temperature sensor 335.

The CVD apparatus shown in FIG. 7 also comprises a cylindrical heating chamber 102. The inner space of the heating chamber 102 is divided into upper and lower sections by the base 302a of the rotatable table 302. A cooling gas supply port 340 for supplying a cooling gas such as the air of room temperature is formed through the side wall in the lower section of the heating chamber 102. On the other hand, an exhaust port 341 is formed through the wall in the upper section of the heating chamber 102. A blower 342 for supplying the cooling gas is connected to the cooling air supply port 340. The cooling gas supply rate is controlled by the blower 342 based on a control signal generated from the control means 150 and transmitted to the blower 342 through a signal transmission line 343.

The lamp heating type heat treating apparatus 300 of the construction described above is operated as described below for subjecting the wafer W to a heat treatment. The apparatus 300 is operated substantially as in the first embodiment described previously with respect to a series of the wafer heat treating processes including covering the transfer of the wafer W into the apparatus, applying heat treatment to the wafer W, and transferring the wafer W after the heat treatment out of the apparatus 300. Therefore, let us describe mainly the operations which characterize the second embodiment of the present invention.

In the second embodiment, the control means 150 serves to control the power supply means 151 so as to supply an electric power to the heating lamps 311 of the heating sources 313 through power supply terminals 306a, with the result that the heating lamps 311 are lighted. At the same time, the control means 150 permits the power supply means 151 to supply an electric power to a driving source 308, with the result that the rotatable table 302 is rotated. It follows that the wafer W is heated by the heating sources 313. The wafer W is heated as already described herein in conjunction with the first embodiment.

It should be noted that the heating sources 313 are cooled in the heating step of the wafer W. Specifically, the control means 150 permits a coolant supply source 334 to supply a coolant, e.g., water, into the coolant passageway 330 formed in the base 302a of the rotatable table 302 through the coolant supply/discharge header 333 and a coolant supply pipe 331. Then, the coolant supplied into the coolant supply passage 330 is guided into a discharge line (not shown) through a coolant discharge pipe 332 and the coolant supply/discharge header 333. In this fashion, the coolant is circulated within the coolant passageway 330.

Also, a cooling gas, e.g., air, blown from the blower 342 is supplied through the cooling gas supply port 340 into the lower section of the heating chamber 301 positioned below the base 302a of the rotatable table 302. The cooling gas supply rate should be controlled at, for example, 200 to 300 l/min. The cooling gas thus supplied into the lower section of the heating chamber 301 is allowed to flow through a blown gas passageway 325 formed in the heating source 313, as shown in FIG. 8. To be more specific, the blown gas flows first into a first clearance 323 from the lower open end of the insertion hole 320 formed in the base 302a, then, into a second clearance 324, and further flows into the upper section of the heating chamber 301 through the through hole 321 formed in the reflector 302b. It should be noted that the cooling gas flows along the heating lamp 311 from the sealing portion 311b toward the lamp body 311a so as to cool the sealing portion 311b and the lamp body 311a.

It should also be noted that the cooling gas flow regulator 326 comprising the leaf springs 327, 328 and having the cooling gas passing holes 327a, 328a formed in these leaf springs 327, 328, respectively, is arranged within the blown gas passageway 325, as seen from FIGS. 8 and 10. In regards to the horizontal positions, these cooling gas passing holes 327a, and 328a are positioned between the outer surface of the lamp body 311a and the inner surfaces of the through hole 321 formed in the reflector 302a. It follows that the cooling gas flowing from the sealing portion 311b toward the lamp body 311a is regulated by the gas flow regulator 326. To be more specific, the cooling gas flows first along the side surface of the sealing portion 311b so as to cool the sealing portion 311b. Then, the cooling gas is guided by the gas flow regulator 326 toward an outer region in the radial direction of the lamp body 311a and, then, flows through the cooling gas passing holes 327a, and 328a into the annular space around the side surface 311c of the lamp body 311a so as to cool the side surface 311c of the lamp body 311a. It should be noted in this connection that the cooling gas does not flow directly into a region near the lower surface 311d of the lamp body 311a. To be more specific, the cooling gas flowing through the cooling gas passing holes 327a, and 328b into the annular space noted above flows only partly and indirectly into the region in the vicinity of the lower surface 311d of the lamp body 311a. It follows that the lower surface 311d of the lamp body 311a is prevented from being cooled locally or directly by the cooling gas, with the result that the lamp body 311a can be cooled uniformly.

The cooling gas regulator 326 produces prominent effects. First of all, the presence of the cooling gas regulator 326 makes it possible to prevent occurrence of temperature distribution over the entire region of the lamp body 311a. In other words, the lamp body 311a can be cooled uniformly.

As described previously, a halogen gas is sealed inside the lamp body 311a of the heating lamp 311. Also, the filament 402, which is made of, for example, tungsten and connected at both ends to the conductive members 401 consisting of, for example, molybdenum foils, is arranged within the lamp body 311a. These conductive members 401 are hermetically sealed with quartz. In a halogen lamp of this construction, a halogen cycle is repeated such that the tungsten of the filament 402 is evaporated to form a tungsten halide and, then, the halide is decomposed so as to bring the resultant tungsten metal back to the filament. In the second embodiment of the present invention, however, the gas flow regulator 326 is included in the heating source 313, making it possible to cool uniformly the lamp body 311a. It follows that the halide is prevented from being attached to a lower temperature region of the lamp body 311a so as to permit the halogen cycle noted above to be performed smoothly. It follows that the life of the heating lamp 311 can be prolonged.

Furthermore, the gas flow regulator 326 serves to prevent the cooling gas from being blown locally and directly into a region near the lower surface 311d of the lamp body 311a, as already pointed out. In this case, the circumferential side surface 311c of the lamp body 311a can be cooled sufficiently unlike the case where the cooling gas blowing rate into the heating chamber 301 is lowered.

On the other hand, the cooling gas flows in a larger flow rate along the sealing portion 311b of the heating lamp 311, making it possible to prevent the sealing portion 311b from over-heating. As a result, it is possible to prevent a clearance from being formed between the conductive member 401 and the quartz glass because of a difference in the thermal expansion coefficient between the conductive member 401 and the quartz glass. Naturally, the halogen gas sealed in the lamp body 311a is prevented from leaking to the outside because the clearance noted above is not formed, leading to a long life of the heating lamp 311.

In order to prevent the lamp body 311a from over-heating and to permit a smooth halogen cycle, it is desirable to cool the lamp body 311a to, for example, 250° to 800° C., preferably to 500 to 600° C. On the other hand, it is desirable to cool the sealing portion 311b to, for example, 350° C. or less, preferably to 200 to 300° C., in order to prevent clearances from being formed between the conductive member 401 and the sealing material of quartz glass by a difference in the thermal expansion coefficient between the two.

In order to prevent the rapid cooling of the temperature of the lamp body 311a of the heating lamp 311 so as to keep its temperature 500 to 600° C., it is desirable for the cooling gas regulator 326 to be capable of controlling the flowing speed of the cooling gas to about 1 to 3 m/s.

As described previously, a plurality of heating sources 313 are supported by the rotatable table 302 in the lamp heating type heat treating apparatus 300 in the second embodiment of the present invention. Since each of the heating sources 313 is provided with a cooling means including the blown gas passageway 325 and the gas flow regulator 326, it is possible to cool the heating lamp 311 included in the heating source 313 to a suitable temperature and to maintain constant the suitable temperature.

It should also be noted that the gas flow regulator 326 comprises two leaf springs 327, and 328 each having a good heat conductivity. As shown in FIGS. 8 and 10, one end portion of each of these leaf springs 327, 328 is bonded under pressure to the side surface of the sealing portion 311a of the heating lamp 311. On the other hand, the other end portion of each of these leaf springs is held between the base 302a and the reflector 302b of the rotatable table 302 so as to be fixed in a bent form. It follows that the heat in the sealing portion 311b can be released efficiently through the leaf springs 327, and 328 into the base 302a. What should also be noted is that one end portion of each of these leaf springs 327, and 328 is strongly pressed against the side surface of the sealing portion 311b because of the elasticity of these leaf springs. It follows that the leaf springs can be strongly and tightly bonded to the sealing portion 311b, leading to a further improved cooling efficiency.

Furthermore, the coolant passageway 330 is formed in the base 302a in a manner to extend through the free region between adjacent heating sources 313, as shown in FIG. 11. Since a coolant is circulated through the coolant passageway 330, the sealing portion 311b can be cooled more efficiently through the leaf springs 327 and 328.

Still further, the temperature sensor 335 is mounted to at least one of the heating lamps 311. To reiterate, the temperature sensor 335 is mounted to the region where the leaf spring 327 included in the gas flow regulator 326 is bonded under pressure to the sealing portion 311b of the heating lamp 311. As described previously, a signal denoting the temperature of the sealing portion 311b measured by the temperature sensor 335 is fed back to the control means 150 through the signal transmission line 336. Based on the particular signal, the control means 150 permits the coolant supply means 334 to control the liquid coolant supply rate as desired, or permits the blower 342 to control the cooling gas supply rate as desired. As a result, the temperature of the sealing portion 311b can be maintained at the most desirable level, leading to a further improvement in the durability of the heating lamp 311.

Figure 12:
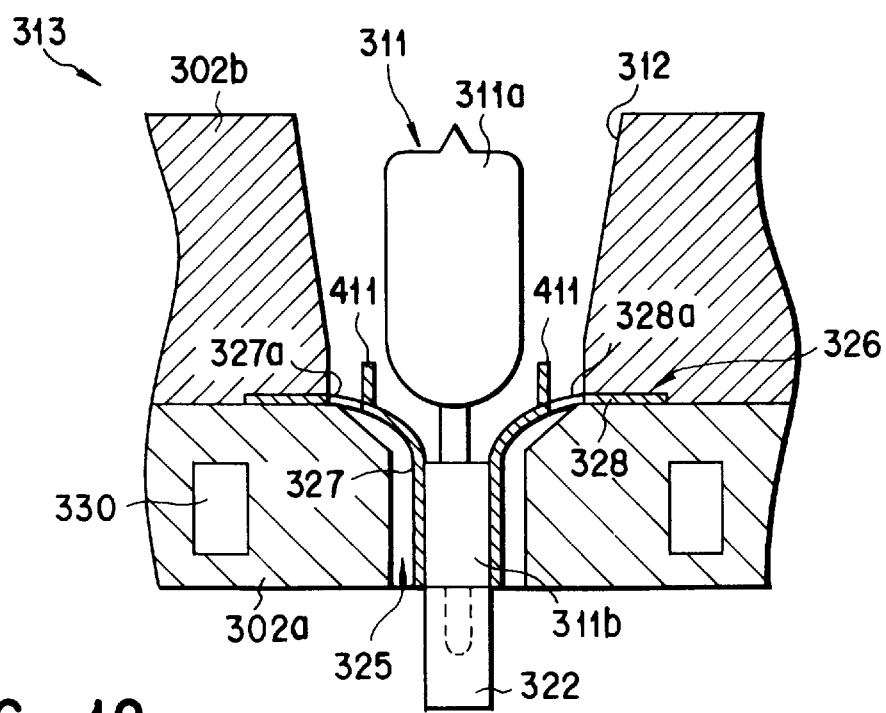
FIG. 12 is a vertical sectional view of a first modification of the heating source of the second embodiment of the present invention.

FIG. 12 is a cross sectional view showing a first modification of the heating source 313 included in the lamp heating type heat treating apparatus 300 according to the second embodiment of the present invention. As is apparent from FIG. 12, guide plates 411 are formed to stand substantially upright from the leaf springs 327 and 328, respectively, included in the gas flow regulator 326. These guide plates 411 extend horizontally along the longer sides of the cooling gas passing holes 327a, and 328a, respectively. It should be noted that each of these guide plates 411 is positioned inside the cooling gas passing hole. Of course, the gas flow regulating effect can be further improved by these guide plates 411.

FIG. 13 is a cross sectional view showing a second modification of the heating source 313 included in the lamp heating type heat treating apparatus 300 according to the second embodiment of the present invention. As is apparent from FIG. 13, auxiliary cooling gas passing holes 412a and 412b are smaller than the holes 327a, 328a are formed in the leaf springs 327 and 328, respectively, of the gas flow regulator 326 in this modification. These auxiliary holes 412a and 412b are positioned below the lower surface 311d of the lamp body 311a. It should be noted that these auxiliary holes 412a and 412b permit supplying a very small amount of the cooling gas to a region near the lower surface 311d of the lamp body 311a without bringing about a local cooling. In this modification, it is also possible to arrange a fin 413 made of, for example, quartz in a manner to cover the lower surface 311d of the lamp body 311a, as shown in FIG. 14.

Incidentally, in the second embodiment of the present invention, the first clearance 323 provided within the insertion hole 320 around the sealing portion 311b of the heating lamp 311 is consecutive around the circumferential surface of the sealing portion 311b. However, it is not absolutely necessary for the first clearance 323 to be consecutive. Furthermore, it is possible for the gas flow regulator 326 to be consecutive in the circumferential direction of the insertion hole 320 so as to be shaped like a bell mouth. Still furthermore, an inert gas such as a nitrogen gas can also be used as the cooling gas in addition to the air used as the cooling gas in each of the first and second embodiments described above.

Figure 15:
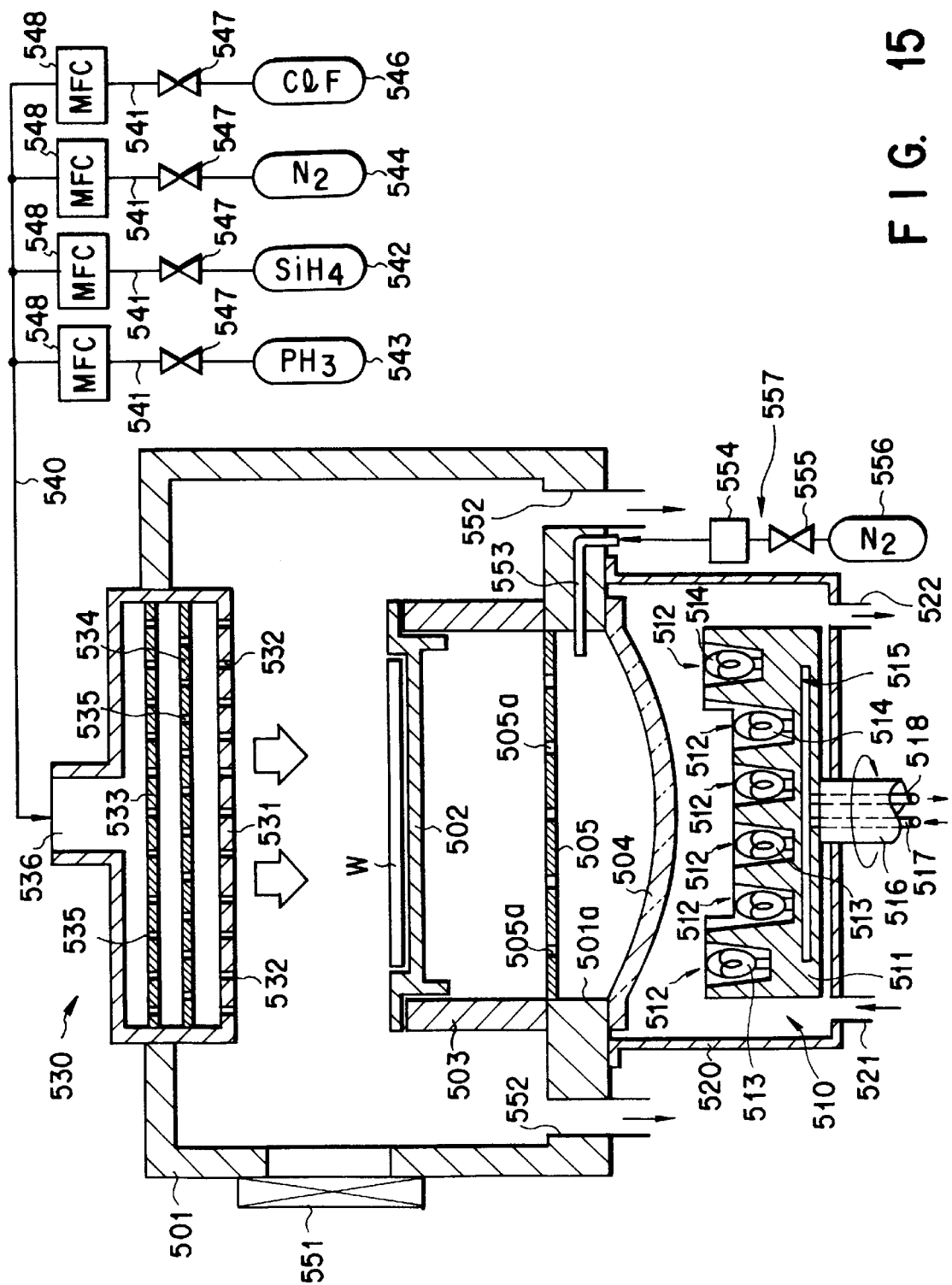
FIG. 15 is a vertical sectional view of a heat treatment apparatus of the third embodiment of the present invention.

FIG. 15 schematically shows a lamp heating type heat treating apparatus 500 according to a third embodiment of the present invention. The apparatus 500 is a one-by-one feeding type CVD apparatus. As shown in FIG. 15, the apparatus 500 comprises a process chamber 501 having a supporting plate 502 arranged therein. The supporting plate 502 has a thickness of, for example, several millimeters, and is made of carbon. The upper surface of the supporting plate 502 is coated with SiC. It is seen that the peripheral portion of the supporting plate 502 is detachably supported by a cylindrical supporting rod 503 erected from a bottom portion of the chamber 501 and made of a heat insulating material, e.g., quartz.

A concave supporting surface 502a is formed on the upper surface of the supporting plate 502 for supporting a wafer W as an object to be processed. A relatively large opening 501a is formed in a central portion of the thick bottom of the process chamber 501. Also, a transmitting window 504 made of a transparent material, e.g., quartz, is hermetically mounted to the thick bottom outside the opening 501a such that the central portion of the window 504 hangs down. Furthermore, a thin plate-like gas flow regulator 505 made of a transparent material, e.g., quartz, and provided with a large number of gas holes 505a is arranged to close the opening 501a.

A heating means 510 including a rotatable table 511 and a large number of heating sources 512 supported by the rotatable table 511 is arranged below the transmitting window 505. As in the second embodiment described previously with reference to FIG. 8, each heating source 512 includes a heating lamp 513 and a cone-shaped reflecting portion 514 positioned to surround the side surface and bottom portion of the heating lamp 513. Each reflecting portion 514 is plated with, for example, gold so as to improve the reflectance.

A clearance within the rotatable table 511 acts as a cooling jacket 515. A rotary shaft 516 is joined to the central portion of the lower wall of the rotatable table 511. Further, a coolant supply pipe 517 and a coolant discharge pipe 518 are arranged within the rotary shaft 516 so as to permit a coolant, e.g., cooling water, to be circulated through the cooling jacket 515.

The rotatable table 511 is prepared by applying a mechanical processing such as cutting to a base member made of a metal such as aluminum or an alloy so as to form the cone-shaped reflecting portion 514. Also, the cooling jacket 515 is formed in the base member. It follows that the rotatable table 511 is of an integral structure and, thus, the cone-shaped reflecting portion 514, etc. can be efficiently cooled by the coolant circulated through the cooling jacket 515.

The entire region of the heating means 510 is covered with a casing 520. A cooling gas blowing port 521 and a discharge port 522 are formed in the bottom portion of the casing 520 for circulating the cooling gas, e.g., cooling air, within the casing 520 for cooling the heating means 510.

On the other hand, a shower head portion 530 is formed in the ceiling portion of the process chamber 501. The shower head portion 530, which is apart from and substantially parallel with the supporting plate 502, is made of, for example, aluminum and is circular in its horizontal cross section. A large number of gas spurting holes 532 each having a diameter of, for example, several millimeters are formed through the bottom 531 of the shower head portion 530. Further, two diffusion plates 533 and 534 are arranged within the shower head portion 530. It is possible to arrange a single diffusion plate or more than two diffusion plates within the shower head portion 530. A large number of diffusion holes 535 are formed in each of these diffusion plates 533 and 534. It should be noted that these diffusion plates are positioned to permit the diffusion holes 535 to be aligned in a vertical direction with the gas spurting holes 532 formed through the bottom 531 of the shower head portion 530 so as to diffuse effectively the gas flowing through the shower head portion 530.

A gas supply port 536 is formed through the ceiling of the shower head portion 530. Process gas sources 542 and 543, a carrier gas source 544 and a cleaning gas source 545 are connected to the gas supply port 536 through a plurality of branched pipes 541 and a pipe 540 connected to these branched pipes 541. A valve 547 is mounted to each of these branched pipes 541 so as to permit the process gases, etc. to be selectively supplied to the gas supply port 536. Also, the gas flow rate from each of the gas sources 542 to 545 is controlled by a mass flow controller (MFC) 548.

The gases used in this embodiment include, for example, silane ($SiH_4$) and phosphine ($PH_3$) gases as the process gases, a nitrogen gas as the carrier gas, and ClF series gases as the cleaning gas. Of course, the gases used in the present invention are not limited to those exemplified above.

A gate valve 551 is formed in the side wall of the process chamber 501 for transferring the wafer W into or out of the chamber 501. Also, a plurality of exhaust ports 552, which are connected to a vacuum pump (not shown), are formed in the bottom portion of the chamber 501 so as to discharge uniformly the exhaust gas from around the supporting plate 502. A cooling jacket (not shown) is also formed in the bottom portion of the chamber 501 for cooling the bottom portion.

Further, an inert gas nozzle 553 is arranged in the bottom portion of the process chamber 501. As seen from FIG. 15, one end portion of the nozzle 553 extends into the free space surrounded by the gas flow regulator 505 and the transmitting window 504. The other end portion of the inert gas nozzle 553 is connected to an inert gas source 556 via a mass flow controller 554 and a valve 555 so as to constitute an inert gas supply means 557.

It should be noted that, during the film forming treatment, the process gas is likely to flow into a free space on the side of the back surface of the supporting plate 502 so as to form a film, which may lower the emissivity of heat rays, on the back surface of the supporting plate 502 and the inner surface of the transmitting window 504. In the present invention, however, an inert gas, e.g., a nitrogen gas, is supplied by the inert gas supply means 557 into the free space noted above. As a result, the process gases are prevented from flowing into the particular free space, making it possible to suppress the film formation noted above.

Still furthermore, a wafer lifter (not shown) for transferring the wafer into or out of the process chamber 501 and a wafer clamp (not shown) for holding the peripheral portion of the wafer are arranged movable in a vertical direction on the upper side of the supporting plate 502.

Figure 17:
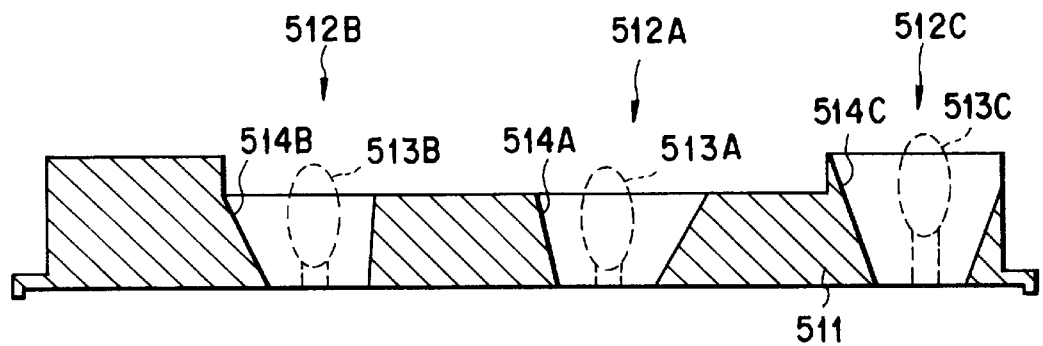
FIG. 17 is a sectional view of the heating means along the line XVII—XVII shown in FIG. 16.

FIG. 16 is a plan view showing the heating means 510. A cross section along the line XVII—XVII shown in FIG. 16 is shown in FIG. 17.

In the heating means 510 included in the lamp heating type heat treating apparatus 500 according to the third embodiment of the present invention, the heating lamps 513 are arranged to achieve temperature compensation in the peripheral portion of the wafer W at which the heat radiation is relatively large to make the temperature lower than in the other region. To achieve the object, the heating lamps 513 are arranged to permit the entire heat rays generated from the heating lamps 513 to be distributed such that the peak of the light distribution is somewhat deviated outward from the periphery of the wafer W on the supporting plate 502.

Thus, a maximum peak of a curve denoting the intensity of the total light or heat ray radiated from all of the heat sources 512, at each of the points along the radial direction of the wafer W is positioned outward a slight distance from the outer periphery of the wafer W. In this description, the intensity of the light or heat ray is defined by the irradiation amount of the light or the heat ray radiated in unit hour and at unit area.

To be more specific, a plurality of heating sources 512 are arranged at a high density on the disklike rotatable table 511 having a limited space so as to increase the heat amount per unit area received by the supporting plate 502 and, thus, to heat rapidly the wafer W to a desired temperature. Also, the rotatable table 511 is divided into three concentric heating zones, i.e., central heating zone A, intermediate heating zone B and outer heating zone C, as shown in FIG. 16. Where, for example, the wafer W is sized at 8 inches, 2 heating sources 512A are arranged to face each other in the central heating zone A. Also, 6 heating sources 512B are arranged to form a circular configuration in the intermediate heating zone B. Furthermore, 14 heating sources 512C are arranged in the outer heating zone C to surround the intermediate heating zone B. In this case, 22 heating sources 512 are arranged in total on the rotatable table 511.

As described previously, the heating source 512 comprises the heating lamp 513 and the cone-shaped reflecting portion 514. Also, the heating lamp 513 consists of, for example, a halogen lamp having a output power of 650 W.

As shown in FIG. 17, these heating lamps 513A to 513C are arranged to stand substantially upright relative to the rotatable table 511. Also, the angle of inclination of each of the cone-shaped reflecting portions 514A to 514C, which are positioned to surround the lamps 513A to 513C, respectively, is set appropriately so as to determine a direction of the heat rays emitted from the lamps 513A to 513C. Hereinafter the direction of the heat ray or the light is referred to as the running direction.

Figure 18:
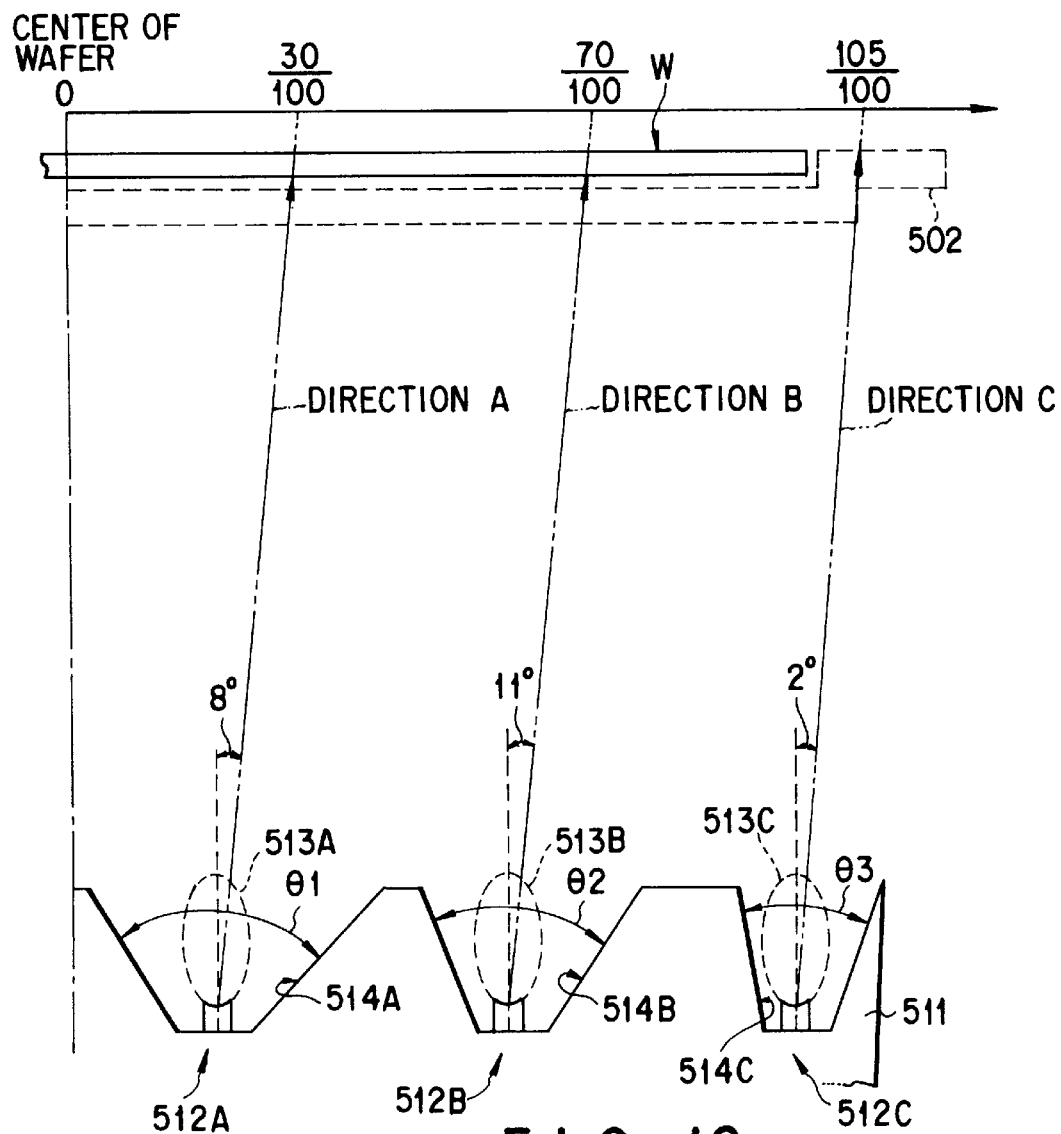
FIG. 18 is a schematic view showing a relation ship between a plurality of heating sources and the direction of light radiated by each heating sources.

In the heating means 510 employed in the third embodiment, the running directions of the heat rays emitted from the heating lamps 513A, 513B and 513C included in the heating zones A, B and C are made different from each other. Specifically, the running direction A, which shown in FIG. 18 by the two-dot chain line, of the 2 heating means 512A included in the central heating zone A is directed to a position on the supporting plate 502 corresponding to at a point about 30%, i.e., 30/100, apart from the center of the wafer W in the radial direction, as shown in FIG. 18. More specifically, the cone-shaped reflecting portions 514A of the heating means 512A is inclined to permit the central portion of the heat rays emitted from each of these lamps to strike the position on the supporting plate 502.

Likewise, the running direction B of the 6 heating means 512B included in the intermediate heating zone B is directed to a position on the supporting plate 502 corresponding to at a point about 70%, i.e., 70/100, apart from the center of the wafer W in the radial direction. Further, the running direction C of the heating means 512C included in the outer heating zone C is directed to a position on the supporting plate 502 corresponding to at a point about 105%, i.e., 105/100, apart from the center of the wafer W in the radial direction. In other words, the running direction C is positioned outside the outer periphery of the wafer W.

It should be noted that the wafer W sized at 8 inches has radius of the 100 mm. It follows that the directions A to C are allowed to direct to the points which apart from the center of the wafer W by 30 mm, 70 mm, and 105 mm, respectively. The tolerance of the points apart form the center of the wafer W, to which these directions A to C, are acceptable within ±4%.

In this embodiment, as shown in FIG. 18, the A, B and C of the cone-shaped reflecting portions 514A, 514B and 514C of the heating sources 512 are inclined appropriately from the direction A to C of the heating means 512A to 512C, respectively. For example, the axis A of the cone-shaped reflecting portion 514A of each of the heating sources 512A included in the central heating zone A is inclined by 8° from the direction A of the heating means 512A. Also, the axis B of the cone-shaped reflecting portion 514B of each of the heating sources 512B included in the intermediate heating zone B is inclined by 11° from the direction B of the heating means 512B. Further, the axis C of the cone-shaped reflecting portion 514C of each of the heating sources 512C included in the outer heating zone C is inclined by 2° from the direction C of the heating means 512C. It should be noted, however, that, if the rotatable table 511 is large enough to allow the heating lamps 513 in each of the heating zones to be positioned right under the desired points of the wafer W, it is possible to align the axes of the cone-shaped reflecting portions 514A to 514C with the axes of the heating lamps 513A to 513C, respectively.

Figure 19:
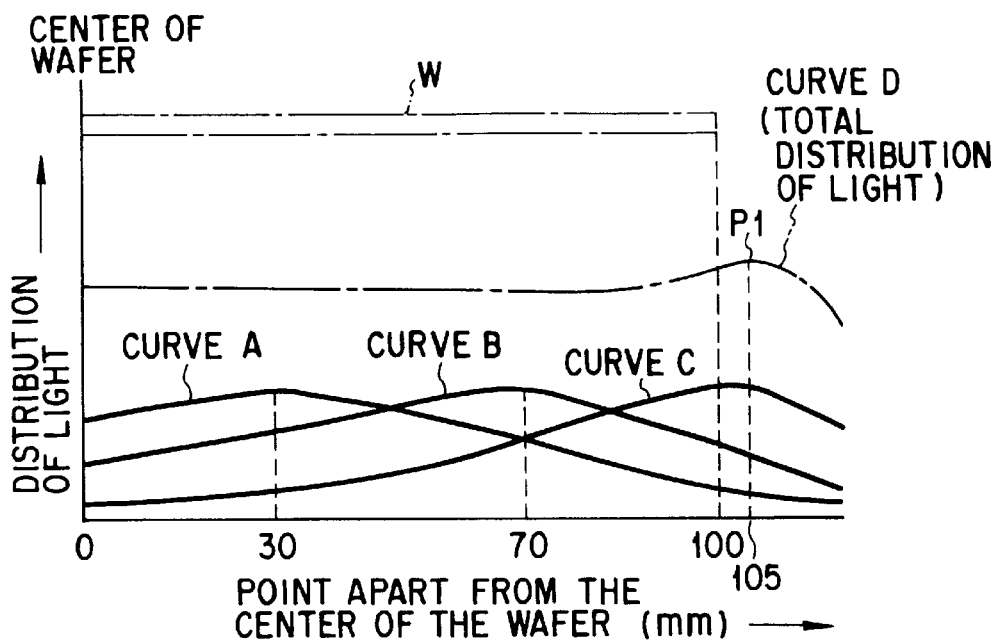
FIG. 19 is a graph showing a relation ship between the distance from the center of the wafer and the distribution of the light in the heating treatment apparatus shown in the FIG. 15.

What should also be noted is that, in this embodiment, an expanding angle θ3 of the cone-shaped reflecting portion 514C, i.e., an angle made by opposite portions of the wall defining the cone-shaped reflecting portion 514C, is set smaller than any of expanding angles θ1, θ2 of the cone-shaped reflecting portions 514A, 514B so as to decrease the directivity of the heating means C. Since the expanding angle θ3 is set smaller, the peak of the light amount is positioned accurately outside the outer periphery of the wafer W, as shown in FIG. 19. In the embodiment shown in FIG. 19, the expanding angle θ3 is set at 33.9° C. in contrast to 46.6° for each of the expanding angles θ1 and θ2.

FIG. 19 shows the distribution of the light rays emitted from the heating lamps 513A to 513C arranged in the heating zones A to C, respectively. Curve A in FIG. 19 represents the distribution of the light rays emitted from the heating lamps 513A arranged in the central heating zone A, with curves B and C denoting the distributions of the light rays emitted from the heating lamps 513B and 513C arranged in the intermediate and outer heating regions B and C, respectively. On the other hand, curve D in FIG. 19 indicates total distribution of light of, as the sum of the light rays emitted from all the heating lamps 513.

As is apparent from FIG. 19, the peaks of curves A, B, and C appear in the points apart from the center of the wafer by 30 mm, 70 mm and 105 mm, respectively. On the other hand, curve D is substantially flat within a region facing the wafer W, and the peak P1 of curve D appears somewhat outside of the outer periphery of the wafer W. In this embodiment, the peak P1 is positioned about 5 mm apart from the outer periphery of the wafer W.

It should be noted that, if the peak P1 is positioned on the outer periphery of the wafer W, the outer peripheral region of the wafer is heated excessively. If the peak P1 is positioned unduly apart from the outer periphery of the wafer W, however, it is impossible to achieve a sufficient temperature compensation in the outer peripheral region of the wafer W. In order to achieve the temperature compensation satisfactorily, it is necessary for the peak P1 of curve D to be positioned within a range of between, for example, 5 mm and 25 mm from the outer periphery of the wafer W. Under the circumstances, the heating sources 512A to 512C are arranged to permit the central portions of the heat rays emitted from the heating means 512A, 512B, 512C to run along the running direction A, B, C, respectively, such that the peak P1 of the sum of the heat rays is positioned somewhat outside the outer periphery of the wafer W.

Figure 20:
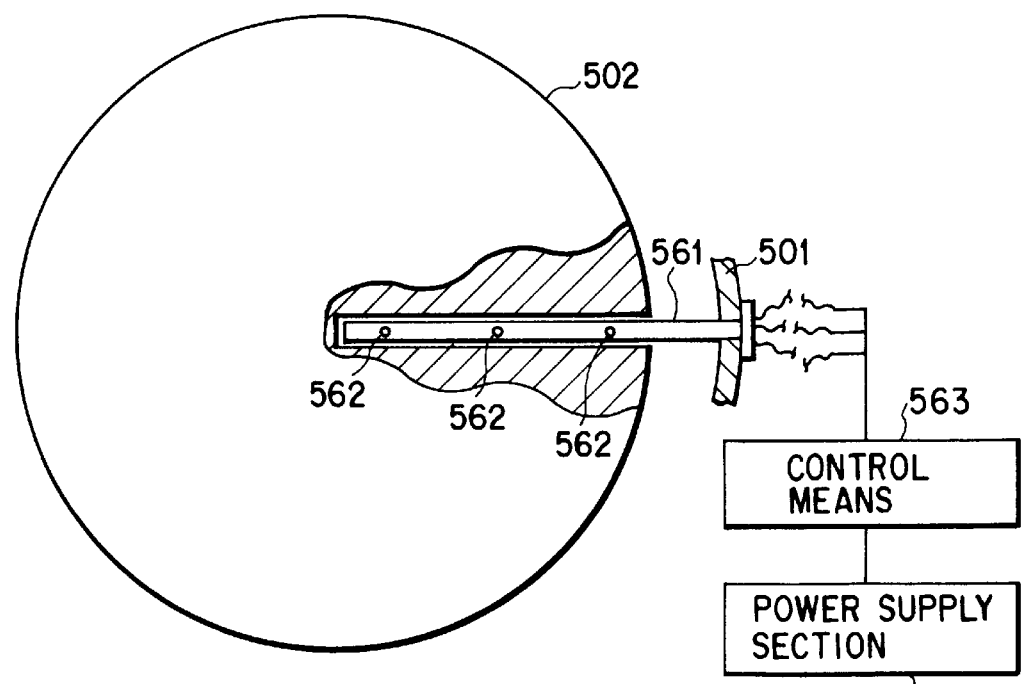
FIG. 20 is a fragmentary sectional view of a modification of the heating means of the heat treatment apparatus shown in the FIG. 15.

In the lamp heating type heat treating apparatus 500 according to the third embodiment of the present invention, a thermocouple rod 561 is removably mounted within the supporting plate 502, as shown in FIG. 20. Specifically, the thermocouple rod 561 is removably inserted from a peripheral portion into a central portion of the supporting plate 502. As shown in the drawing, three thermocouples 562 are sealed in the thermocouple rod 561 in positions apart from each other in the radial direction of the supporting plate 502. To be more specific, these three thermocouples 562 are positioned to correspond to the heating zones A, B, and C, respectively. Detection signals generated from these thermocouples 562 are supplied to a control means 563 to which is connected a power supply section 564 which permits supplying an electric power to the heating lamps 513 arranged in the heating zones A to C. In other words, the control means 563 permits controlling accurately the outputs of the heating lamps 313A to 513C based on the signals generated from the thermocouples 562.

The lamp heating type heat treating apparatus 500 according to the third embodiment of the present invention comprises the heating means 510 of the construction described above. Where the apparatus 500 is used for forming a film by CVD on a surface of the wafer W by the operation substantially equal to that described previously in conjunction with the first embodiment, the heat rays emitted from the heating means 512A to 512C are allowed to strike the back surface of the supporting plate 502 so as to heat the supporting plate 502 while the rotatable table 511 of the heating means 510 is kept rotated. As a result, the wafer W is heated by mainly heat conduction to and maintained at a predetermined process temperature.

In this case, the outputs of the plural heating lamps 513 are controlled on the basis of the outputs of the three thermocouples 562 so as to allow the total distribution of the heat rays emitted from the heating lamps 513A to 513C to be distributed as denoted by curve D in FIG. 19.

Figure 21:
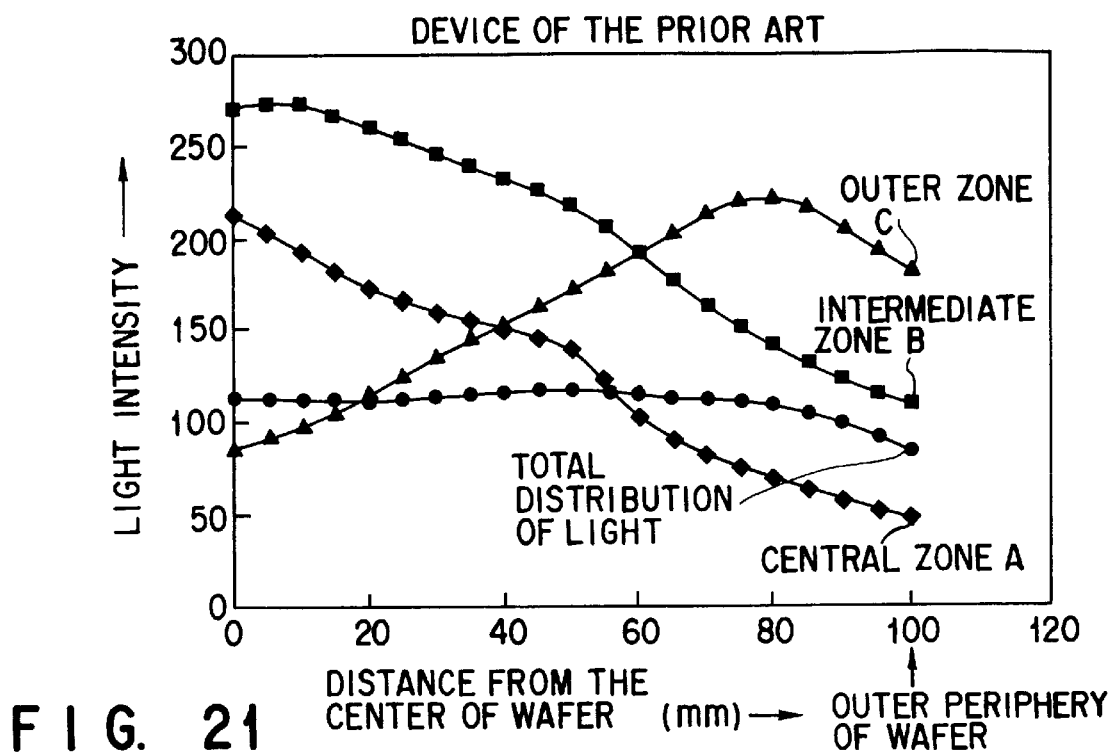
FIG. 21 is graph showing a relationship between a distance from the center of the wafer and light intensity in the apparatus of the prior art.

FIG. 21 is a graph showing the light distribution characteristics of a conventional apparatus. In this conventional apparatus, the heating lamps are arranged to form three heating zones. Also, the heat rays emitted from the heating lamps are controlled for each heating zone. However, since distribution of the sum of the heat rays is not controlled appropriately, it is impossible to heat uniformly the entire surface of the wafer W.

Figure 22:
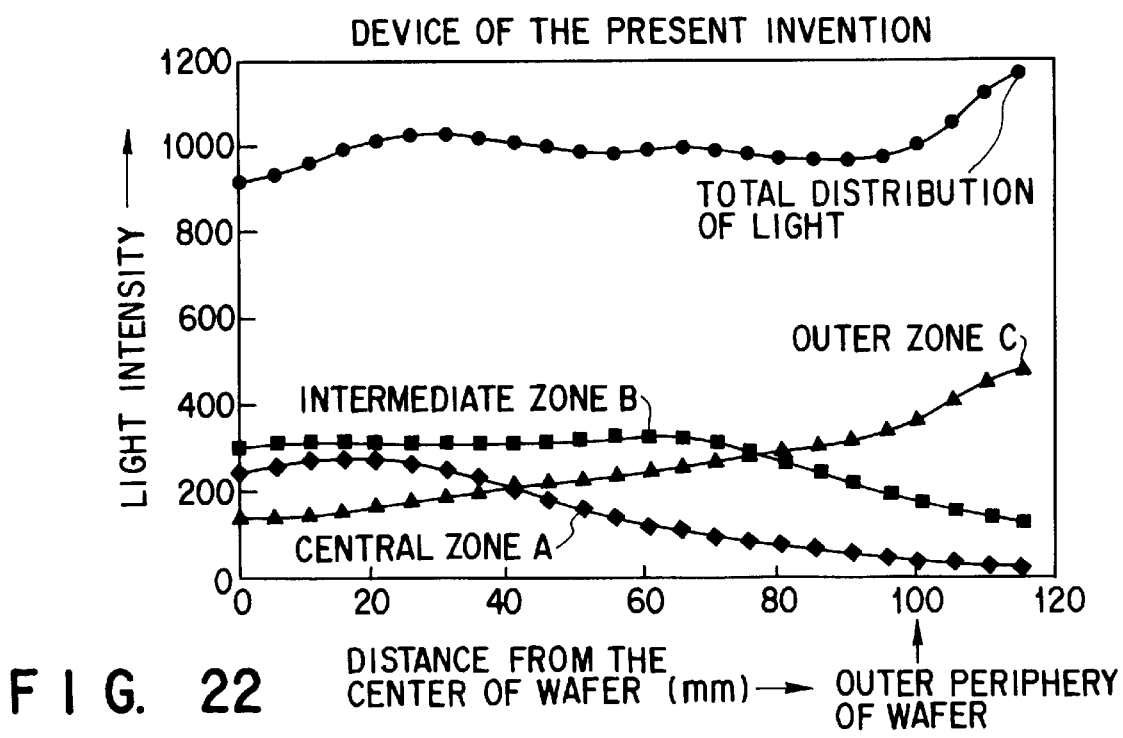
FIG. 22 is graph showing a relationship between a distance from the center of the wafer and light intensity in the apparatus of the present invention.

On the other hand, FIG. 22 is a graph showing the light distribution characteristics of the lamp heating type heat treating apparatus 500 according to the third embodiment of the present invention. As seen from the graph, the total distribution of the heat rays emitted from the heating sources 512 included in all the heating zones A to C is distributed to have a peak positioned 5 mm outside the outer periphery of the wafer W. Because of the particular heat ray distribution, temperature over the entire surface of the wafer W was found to be highly uniform, compared with the conventional apparatus.

As described above, the heating means 510 makes it possible to compensate appropriately for the heat radiation from the outer peripheral region of the wafer W in the lamp heating type heat treating apparatus 500 according to the third embodiment of the present invention. As a result, the uniformity of temperature over the entire surface of the wafer W can be improved, making it possible to improve the uniformity of the thickness of the film formed by CVD on the wafer W.

It should be noted in particular that the expanding angle $\theta3$ of the cone-shaped reflecting portion 514C in the outer heating zone C is set smaller than any of the expanding angles $\theta1$ and $\theta2$ of the cone-shaped reflecting portions 514A and 514B, respectively, so as to control as desired the running direction of the heat rays emitted from the heating lamps 513C. As a result, it is possible to compensate sufficiently for the heat radiation from the peripheral portion of the wafer W, leading to a further improved uniformity of the temperature distribution over the entire surface of the wafer W.

In the third embodiment, the plural heating sources 512 are arranged to form three heating zones. However, the number of heating zones need not be particularly limited. Also, the expanding angle $\theta3$ of the cone-shaped reflecting portion 514C is made somewhat smaller than the expanding angles $\theta1$ and $\theta2$ so as to improve the distribution of the sum of the heat rays emitted from all the heating lamps 513. However, the expanding angles $\theta1$ to $\theta3$ are not particularly limited, as far as the sum of the heat rays emitted from all the heating lamps can be distributed as shown in FIG. 19. For example, the expanding angles $\theta1$ to $\theta3$ can be made equal to each other. Alternatively, the expanding angle $\theta1$ can be made smaller than any of the expanding angles $\theta2$ and $\theta3$. Further, the number of heating sources in each heating zone need not be particularly limited.

The lamp heating type heat treating apparatus according to any of the first to third embodiments described above can also be used for treatments other than the CVD treatment. For example, the apparatus can be used for the oxidation, diffusion, and annealing treatments. Further, it is possible to omit the susceptor such that the semiconductor wafer can be heated directly by the energy of heat rays emitted from the heating lamp. Still further, the objects to be treated by the apparatus of the present invention include, for example, LCD substrates in addition to the semiconductor wafer W.

The techniques described above in conjunction with the heat treating apparatuses according to the first to third embodiments of the present invention can be used in combination.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

What is claimed is:

1. A heat creating apparatus for manufacturing a semiconductor device, comprising:

a process chamber;

a support configured to support an object arranged within said process chamber;

a supply system configured to supply a process gas into said process chamber;

an exhaust system configured to evacuate said process chamber;

a transmitting window formed within the process chamber;

a heater configured to heat said object, said heater comprising,
  a plurality of heating sources configured to irradiate via said transmitting window said object directly or indirectly with heat rays, and
  a table having said heating sources arranged on the front surface thereof, each of said heating sources comprising a heating lamp and a reflecting portion;

a rotation driver configured to rotate the heater and the support relative to each other;

a blown gas passageway extending from the front surface to the back surface of the table and included in each of said heating sources having said heating lamps arranged therein;

a cooling gas supply/discharge mechanism configured to allow a cooling gas to flow through said blown gas passageway; and a gas flow regulator arranged within the blown gas passageway and configured to prevent said cooling gas from being blown directly and locally against a part of a lamp body of the heating lamp.

2. The apparatus according to claim 1, wherein said gas flow regulator is arranged between the lamp body and a sealing portion of the heating lamp.

3. The apparatus according to claim 1, wherein;
said gas flow regulator is formed of a plate-like member configured to regulate the flow of the cooling gas blown into the blown gas passageway; and
a gas passing hole is made in a part of said plate-like member.

4. The apparatus according to claim 3, wherein a part of said plate-like member is connected to the sealing portion of the heating lamp and another part is connected to said table.

5. The apparatus according to claim 4, wherein said plate-like member is formed of an elastic body having a thermal conductivity.

6. The apparatus according to claim 5, wherein a part of said plate-like member is elastically pressed against the sealing portion of the heating lamp.

7. The apparatus according to claim 3, wherein an auxiliary gas passing hole is made in the plate-like member so as to allow a portion of the cooling gas to be blown toward a region below the lamp body of the heating lamp.

8. The apparatus according to claim 3, further comprising a guide member standing substantially upright from said plate-like member and extending along an edge on the side of the heating lamp of the gas passing hole made in the plate-like member.

9. The apparatus according to claim 1, further comprising:
a coolant passageway formed within the table and configured to allow a coolant to pass therethrough; and
a coolant supply/discharge mechanism configure to supply said coolant into said coolant passageway and to discharge the coolant through said coolant passageway.

10. The apparatus according to claim 1, further comprising:
a heating chamber surrounding said heater and divided into a first free space region on the front surface side of the table and a second free space region on the back surface side of the table, wherein said cooling gas is supplied into said second free space region and discharged through said first free space region by said cooling gas supply/discharge mechanism.

11. The apparatus according to claim 1, further comprising:
a temperature sensor mounted to the gas flow regulator; and
a controller configure to control the temperature of the heating lamp based on a measuring signal generated from said temperature sensor.

12. The apparatus according to claim 1, further comprising fins for regulating the flow of the cooling gas which has passed through the gas flow regulator, said fins being mounted below the lamp body of the heating lamp.

13. A heating apparatus for manufacturing a semiconductor device, comprising:
a main heater configured to heat an object to be processed, and including a plurality of main heating sources concentrically arranged and configured to irradiate said object directly or indirectly with heat rays, wherein said main heating sources are divided into a plurality of groups arranged to correspond to a plurality of concentric heating zones formed on a surface of the object;
a support configured to support the object in a heating position of said main heater;
a rotation driver configured to rotate the main heater and said support relative to each other; and
an auxiliary heater configured to compensate for an uneven temperature distribution in an angular direction caused in said object by the heating of the main heater, wherein said auxiliary heater is controllable such that it heats independently of the main heater, and comprises an auxiliary heating source which is arranged within one of said groups of the main heating sources arranged on an outermost region of the object and which enables irradiation of the object directly or indirectly with heat rays.

14. The apparatus according to claim 13, wherein said groups of the main heating sources are controllable such that they heat independently of each other.

15. The apparatus according to claim 13, wherein said main heater comprises a table having a front surface on which said main heating sources are arranged.

16. The apparatus according to claim 15, wherein said auxiliary heater is rotated together with said main heater relative to said support.

17. The apparatus according to claim 16, wherein said auxiliary heating source are arranged on said front surface of the table together with said main heating sources.

18. The apparatus according to claim 13, further comprising:
a process chamber surrounding said support, and configured to accommodate the object;
a supply system configured to supply a process gas into said process chamber; and
an exhaust system configured to evacuate said process chamber.

19. The apparatus according to claim 13, further comprising a controller configured to cause said auxiliary heater to heat the object with a power output different from that of the main heater during the period of time when the irradiating position of the heat rays emitted from the auxiliary heating source pass through an uneven temperature region on the surface of the object.

20. The apparatus according to claim 17, wherein said controller is configured to cause said auxiliary heater to heat the object with a power output higher than that of the main heater during the period of time when the irradiating position of the heat rays emitted from the auxiliary heater pass through a temperature region lower than a second region on the surface of the object.

21. The apparatus according to claim 17, wherein said controller is configured to cause said auxiliary heater to heat the object with a power output lower than that of the main heater during the period of time when the irradiating position of the heat rays emitted from the auxiliary heater pass through a temperature region higher than the second region on the surface of the object.

22. The apparatus according to claim 17, further comprising a temperature sensor configured to measure the surface temperature of the object, wherein said controller is configured to control the auxiliary heater based on a measuring signal generated from said temperature sensor.

23. A heating apparatus for manufacturing a semiconductor device, comprising:
a main heater configured to heat an object to be processed, and including a plurality of main heating sources concentrically arranged and configured to irradiate said object directly or indirectly with heat rays,
a support configured to support the object in a heating position of said main heater;
a rotation driver configured to rotate the main heater and said support relative to each other;
an auxiliary heater configured to compensate for an uneven temperature distribution in an angular direction caused in said object by the heating of the main heater, wherein said auxiliary heater is controllable such that it heats independently of the main heater, and comprises an auxiliary heating source which is arranged among said main heating sources and which enables irradiating the object directly or indirectly with heat rays; and a controller configured to cause said auxiliary heater to heat the object with a power output different from that of the main heater during the period of time when the irradiating position of the heat rays emitted from the auxiliary heating source pass through an uneven temperature region on the surface of the object.

24. The apparatus according to claim 22, wherein said controller is configured to cause said auxiliary heater to heat the object with a power output higher than that of the main heater during the period of time when the irradiating position of the heat rays emitted from the auxiliary heater pass through a temperature region lower than a second region on the surface of the object.

25. The apparatus according to claim 23, wherein said controller is configured to cause said auxiliary heater to heat the object with a power output lower than that of the main heater during the period of time when the irradiating position of the heat rays emitted from the auxiliary heater pass through a temperature region higher than the second region on the surface of the object.

26. The apparatus according to claim 23, further comprising a temperature sensor configured to measure the surface temperature of the object, wherein said controller is configured to control the auxiliary heater based on a measuring signal generated from said temperature sensor.

27. The apparatus according to claim 23, wherein said main heater comprises a table having a front surface on which said main heating sources are arranged.

28. The apparatus according to claim 27, wherein said auxiliary heater is rotated together with said main heater relative to said support.

29. The apparatus according to claim 28, wherein said auxiliary heating source are arranged on said front surface of the table together with said main heating sources.

30. The apparatus according to claim 28, wherein said main heating sources are divided into a plurality of groups arranged to correspond to a plurality of concentric heating zones formed on a surface of the object.

31. The apparatus according to claim 30, wherein said groups of the main heating sources are controllable such that they heat independently of each other.

32. The apparatus according to claim 30, wherein said auxiliary heater is arranged within one of said groups of the main heating sources arranged on an outermost region of the object.

33. The apparatus according to claim 23, further comprising:

a process chamber surrounding said support, and configured to accommodate the object;

a supply system configured to supply a process gas into said process chamber; and an exhaust system configured to evacuate said process chamber.

34. The apparatus according to claim 23, wherein said object is a substantially disk-like object:

wherein said heater is arranged to permit a peak of a curve of heat rays striking the object to be positioned partially outside of the outer periphery of the object supported by the support;

said curve denotes an amount of heat ray irradiation and radially extends from the center of the object to beyond the outer periphery of the object; and said peak of the curve is positioned to fall within a range of between 5 mm and 25 mm from the outer periphery of the object.

35. The apparatus according to claim 28, wherein:

said plural heating sources arranged on the front surface of the table are divided to form a plurality of concentric regions; and a plurality of heating sources belonging to one of said plural concentric regions differ from a plurality of heating sources belonging to another concentric region in the running direction of the central portion of the heat rays emitted from the heating sources.

36. The apparatus according to claim 29, wherein:

said plural heating sources arranged on the front surface of the table are divided to form three concentric regions;

the running direction of the central portion of the heat rays emitted from the heating sources in the inner concentric region is positioned to fall within a range of 30/100±4% based on the radius of the object;

the running direction of the central portion of the heat rays emitted from the heating sources in the intermediate concentric region is positioned to fall within a range of 70/100±4% based on the radius of the object; and the running direction of the central portion of the heat rays emitted from the heating sources in the outer concentric region is positioned to fall within a range of 105/100±4% based on the radius of the object.

37. The apparatus according to claim 29, wherein:

said heating source comprises a heating lamp and a reflecting portion surrounding said heating lamp; and an expanding angle of the heating source belonging to the outer concentric region defined by opposite portions of the wall defining said reflecting portion is smaller than that in the heating source belonging to another concentric region.

* * * * *